(12) United States Patent
Yamaguchi et al.

(10) Patent No.: US 6,791,178 B2
(45) Date of Patent: Sep. 14, 2004

(54) MULTI-CHIP MODULE INCLUDING SEMICONDUCTOR DEVICES AND A WIRING SUBSTRATE FOR MOUNTING THE SEMICONDUCTOR DEVICES

(75) Inventors: Yoshihide Yamaguchi, Fujisawa (JP); Takao Terabayashi, Yokohama (JP); Hiroyuki Tenmei, Yokohama (JP); Hiroshi Hozoji, Yokohama (JP); Naoya Kanda, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 112 days.

(21) Appl. No.: 09/997,175

(22) Filed: Nov. 30, 2001

(65) Prior Publication Data

US 2002/0180015 A1 Dec. 5, 2002

(51) Int. Cl.[7] .............................................. H01L 23/04
(52) U.S. Cl. ...................................................... 257/699
(58) Field of Search ................................. 257/684, 685, 257/686, 678, 698–702, 708, 711, 723, 724, 729, 737, 738, 747, 788, 777, 778, 780

(56) References Cited

U.S. PATENT DOCUMENTS 6,208,525 B1 * 3/2001 Imasu et al. ................ 361/783

* cited by examiner

Primary Examiner—Hung Vu
(74) Attorney, Agent, or Firm—Antonelli, Terry, Stout & Kraus, LLP

(57) ABSTRACT

A multi-chip module has semiconductor devices and a wiring substrate for mounting the semiconductor devices, in which the wiring substrate comprises a glass substrate having holes formed by sand blasting and a wiring layer formed on the surface of the glass substrate and having wiring and an insulation layer.

19 Claims, 31 Drawing Sheets

Non-alkali glass by sand blasting

Light sensitive glass by photoetching method

100

Physical property value and sputtering resistance
of the material for stress relaxation layer
(X: cracks generated, △: wrinkles generated, ○: no abnormality)

← Sand blast resist film
← 1

← Mask

← 100

MULTI-CHIP MODULE INCLUDING SEMICONDUCTOR DEVICES AND A WIRING SUBSTRATE FOR MOUNTING THE SEMICONDUCTOR DEVICES

This is a divisional of new application Ser. No. 09/995,772 entitled "Semiconductor Module" filed on Nov. 29, 2001 by the same inventors, Yamaguchi et al.

BACKGROUND OF THE INVENTION

This invention relates to a semiconductor module, to electronic equipment using the module and to a method of manufacturing the same.

Heretofore, so-called multi-chip modules have been used for miniaturizing the size and improving the performance of electronic devices, in which bare chips (various kinds of semiconductor devices and ICs having desired functions in the shape of chips are collectively referred to as bare chips in this specification) and various kind of passive elements, such as resistors, capacitors and coils, are connected in combination with each other to constitute a module.

SUMMARY OF THE INVENTION

However, in the existent multi-chip modules (MCM), since the heat expansion coefficient is different for semiconductor chips, for a substrate for mounting the semiconductor chips and for a substrate for mounting the substrate on which the semiconductor chips are mounted, thermal stress is generated during operation of the multi-chip module (MCM), thereby to bring about a problem in that the connection reliability can not be ensured.

Further, the manufacture of the multi-chip module (MCM) also involves the following problems; A ceramic wiring substrate for use in the multi-chip module is passed through the steps of baking and cooling during manufacture. In this process, the substrate is press bonded under lamination with a binder detaching from a green sheet and a conductor paste. Since the deformation rate is different in each of these elements, wirings tend to be deformed in a case of a fine wiring pattern. Further, while they are cooled from the sintering temperature, after the completion of the press bonding, since the ceramic substrate and the wiring material each cause thermal deformation also in this process, it was difficult to calculate the thermal deformation for the entire substrate in the manufacture of the multi-chip module. Accordingly, since the wiring width of the wiring substrate on which semiconductor chips are mounted increases, the number of layers of the wiring substrate increases, making it difficult to attain a thin and small mounting structure.

Japanese Patent Application Hei 8-527489 (International Laid-Open No. WO/97/03460) discloses a glass substrate for mounting semiconductor chips. However, the glass substrate is adapted to mount semiconductor chips on one surface, but wiring layers comprising insulation layers and conductor layers are not formed on both surfaces of the glass substrate.

Japanese Patent Laid-Open Hei 10-242206 discloses a substrate in which through holes are formed in light sensitive glass by using an exposure/developing process. The substrate is designed to serve both as an inspection substrate during burn-in upon mounting bare chips and as an interposer (material interconnecting a bare chip and an external terminal) for connection with a substrate, such as a printed circuit board, but it is not adapted to be formed with multiple wiring layers, comprising insulation layers and conductor layers, on a core substrate. Further, it does not disclose the formation of through holes by sand blasting.

Japanese Patent Laid-Open Hei 11-243267 discloses a wiring substrate in which wirings are formed on an insulation substrate having through holes. This publication indicates that the insulation substrate is formed of sintered ceramics, such as sintered glass ceramics, and is manufactured, for example, by forming a ceramic green sheet, applying an appropriate punching to the ceramic green sheet to form it into a predetermined shape and then sintering the same at a high temperature. Further, to form wirings which are less disconnected on the surface of the insulation substrate and the inner wall surface of the through holes, the diameter of a through hole is gradually enlarged from the center to both open ends of the substrate. As a method of forming a through hole, using a trigonal drilling blade or a laser fabrication method is disclosed. However, the insulation substrate is made of glass ceramics and is not a glass substrate, and multiple wiring layers comprising insulation layers and conductor layers are not formed on the insulation substrate.

The present invention intends to provide a multi-chip module having improved connection reliability between semiconductor chips and a wiring substrate on which semiconductor chips are mounted, as well as improved connection reliability between the multi-chip module and a mounting substrate on which the multi-chip module is mounted.

As a result of research and development, we have found that it is important to improve the constitution of a wiring, substrate by using a glass substrate having a surface smoothness and small heat expansion coefficient, as well as to provide a manufacturing process therefor which makes it possible to provide a wiring substrate that is capable of high density wiring at a reduced cost.

We have also found that it is important to provide a multi-layered wiring substrate with a stress relieving mechanism in order to improve the connection reliability of an electronic device using the wiring substrate, for example, a multi-chip module.

Among the aspects and features of the invention disclosed in this application for attaining the foregoing objects, an outline of typical aspects of the invention will be explained below.

A multi-chip module includes semiconductor devices and a wiring substrate for mounting the semiconductor devices, wherein the wiring substrate comprises a glass substrate having holes for, establishing electrical connection between both surfaces, and plural wiring layers each formed on the surface of the glass substrate and having wirings (conductor layer) and an insulation layer, the diameter of the hole being enlarged from one open end to the other open end.

A multi-chip module includes semiconductor devices and a wiring substrate for mounting the semiconductor devices, wherein the wiring substrate comprises a glass substrate having holes formed by sand blasting and a wiring layer formed on the surface of the glass substrate and having wirings and an insulation layer.

A multi-chip module as defined above, wherein the semiconductor devices and the wiring substrate are connected by means of a lead free solder.

A multi-chip module includes semiconductor devices and a wiring substrate for mounting the semiconductor devices, wherein the wiring substrate comprises a first substrate having through holes, a first wiring layer formed on one surface of the first substrate and having first wirings and a first insulation layer, a second wiring layer formed on the other surface of the first substrate and having second wirings and a second insulation layer, in which the heat expansion coefficient is different between the first wiring layer and the second wiring layer.

A multi-chip module as defined above, wherein the heat expansion coefficient of the first wiring layer is close to the heat expansion coefficient of the semiconductor device, and the heat expansion coefficient of the second wiring layer is close to the heat expansion coefficient of a mounting substrate for mounting the wiring substrate.

A multi-chip module has semiconductor devices and a wiring substrate for mounting the semiconductor devices, wherein the wiring substrate comprises a first substrate having through holes; a first wiring layer having first wirings and a first insulation layer formed to the surface of the first substrate on the side where the semiconductor devices are mounted; and a second wiring layer having second wirings and a second insulation layer formed to the surface of the first substrate on the side where the wiring substrate is mounted; wherein the heat expansion coefficient of the first wiring layer is close to the heat expansion coefficient of the semiconductor device, and the heat expansion coefficient of the second wiring layer is close to the heat expansion coefficient of a mounting substrate for mounting the wiring substrate.

A multi-chip module has semiconductor devices and a wiring substrate for mounting the semiconductor devices, wherein the wiring substrate comprises a first substrate having through holes with a heat expansion coefficient being from 3 ppm/° C. to 5 ppm/° C.; a first wiring layer formed on one surface of the first substrate having first wirings and a first insulation layer; a second wiring layer formed on one surface of the first substrate having second wirings and a second insulation layer; and a third insulation layer formed to the surface of the second wiring layer on the side opposite to the first substrate; wherein the modulus of elasticity of the third insulation layer is from 0.1 GPa to 10 GPa.

A multi-chip module comprises semiconductor devices and a wiring substrate for mounting the semiconductor devices, wherein the wiring substrate has a first substrate having through holes with a heat expansion coefficient being from 3 ppm/° C. to 5 ppm/° C.; a first wiring layer having first wirings and a first insulation layer formed on one surface of the first substrate; a second wiring layer having second wirings and a second insulation layer formed on one surface of the first substrate; and a third insulation layer formed to the surface of the second wiring layer on the side opposite to the first substrate; wherein the third insulation layer relieves the thermal stresses caused between the wiring substrate and a mounting substrate for mounting the wiring substrate.

A method of manufacturing a multi-chip module comprises a step of forming a wiring layer having wirings and an insulation layer to at least one surface of a glass substrate, a step of forming holes in the glass substrate by sand blasting, and a step of mounting semiconductor devices on the wiring layer.

A method of manufacturing multi-chip module comprises a step of forming a first wiring layer including wirings and an insulation layer on one surface of a glass substrate, a step of forming a second insulation layer for relieving stresses caused between the glass substrate and a mounting substrate for mounting the wiring substrate, a step of forming first holes in the second insulation layer, a step of applying sand blasting to the first holes thereby forming second holes in the glass substrate, and a step of mounting a semiconductor device on the first wiring layer.

A method of manufacturing a multi-chip module comprises a step of forming a first wiring layer having a first wiring and a first insulation layer on one surface of the glass substrate, a step of forming a second wiring layer having second wirings and a second insulation layer on the other surface of the glass substrate, a step of forming a third insulation layer for relieving stresses caused between the glass substrate and a mounting substrate for mounting wiring substrate, a step of forming first holes in the third insulation layer, a step of conducting sand blasting to the first holes thereby forming second holes in the glass substrate, and a step of mounting semiconductor devices on the first wiring layer.

A method of manufacturing a multi-chip module comprising a step of forming through holes in a glass substrate by sand blasting, a step of forming first wirings on the inner wall surface of the through holes and on the glass substrate, a step of filling the through holes with an electric conductive material or insulation material, a step of forming a first insulation layer on one surface of the glass substrate, a step of forming a second insulation layer on the other surface of the glass substrate, a step of forming holes in the second insulation layer, a step of forming second wirings on the inner wall surface of the hole in the second insulation layer, a step of forming third wirings to the surface of the first insulation layer on the side opposite to the glass substrate, and a step of mounting semiconductor devices on the first insulation layer so as to establish an electrical connection with respect to the third wiring.

A method of manufacturing a multi-chip module comprises a step of preparing a wiring substrate including a glass substrate having holes for establishing electrical connection on both surfaces and a plurality of wiring layers having a wiring and an insulation layer formed on the glass substrate, a step of mounting plural semiconductor devices on the wiring substrate, a step of conducting a test between semiconductor devices, and a step of replacing the semiconductor devices in accordance with the result of the operation test and a step of separating the wiring substrate into individual portions.

DESCRIPTION OF THE PREFERRED EMBODIMENTS

Figure 1:
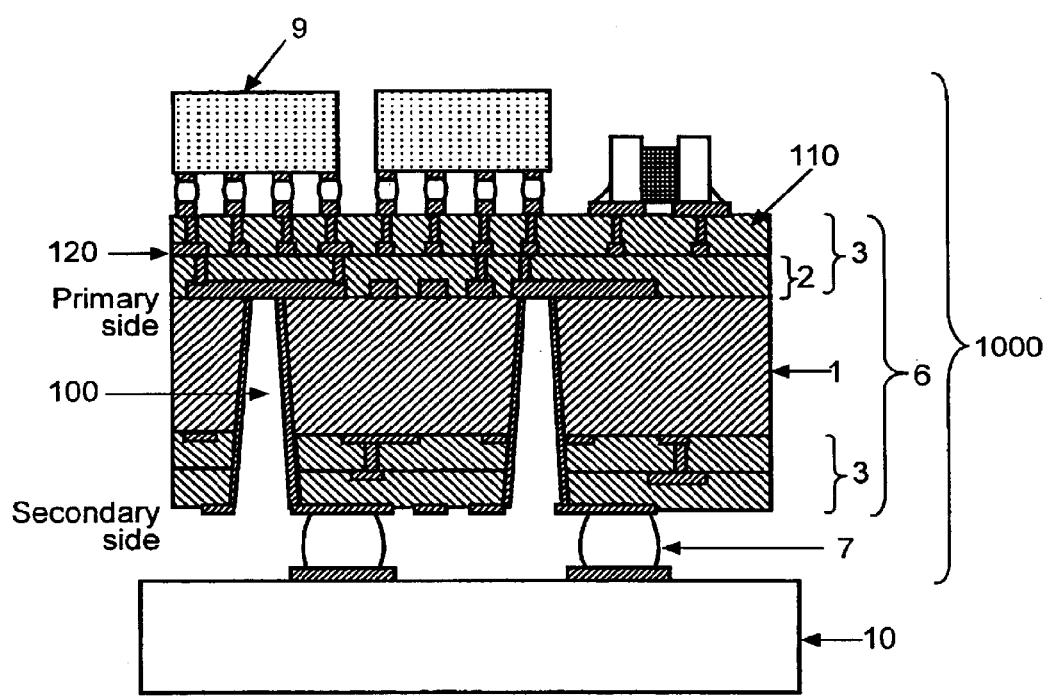
FIG. 1 is a cross-sectional view taken along a line a–a' in FIG. 8, showing a semiconductor module according to an embodiment of this invention.

A semiconductor module according to this invention will be explained in detail by way of preferred embodiments with reference to the drawings. Throughout the drawings, those elements having identical functions are identified by the same reference numerals, for which repeated explanations will be omitted.

Figure 2:
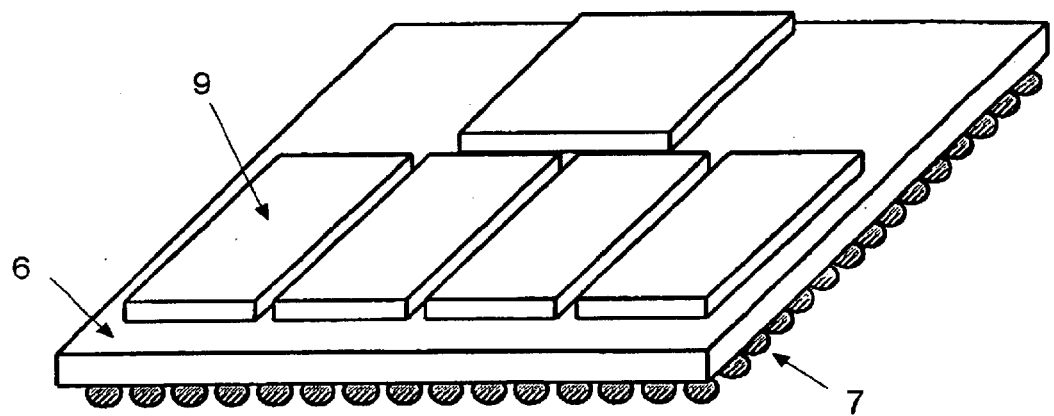
FIG. 2 is a perspective view of a semiconductor module according to another embodiment of this invention.

FIG. 1 is a cross sectional view showing a portion of an embodiment of a semiconductor module 1000, in which semiconductor devices 9 (semiconductor chip, LSI and the like) and individual parts, such as capacitors, are mounted on a multi-layered wiring substrate 6, including a substrate 1 (hereinafter sometimes referred to also as a core substrate 1 or an insulation substrate 1) and multi-wiring layers 3. FIG. 1 is a cross sectional view taken along line a–a' in FIG. 8. FIG. 1 shows a state in which a semiconductor module is mounted on a mounting substrate 10. FIG. 2 is a perspective view showing an example of the entire semiconductor module.

The substrate 1 has through holes for establishing electrical connection between the surface and the rear face of the substrate 1. The multi-wiring layer 3 comprises at least one layer of thin film wiring layer 2, and the thin film wiring layer 2 has wirings 120 and an interlayer insulation layer 110. The wirings 120 include wirings in via holes and wiring pads.

Further, an insulation layer (protection layer) may be formed optionally between each of the wirings on the uppermost surface of the multi-wiring layer 3. The protection layer prevents intrusion of impurities to the interlayer insulation layer or wirings and prevents wetting and spreading of solder. The multi-layered wiring substrate 6 itself may optionally have external connection terminals, for example, solder bumps 7.

The multi-layered wiring substrate 6 used for the semiconductor module in the case of silicon can be manufactured in the form of a wafer, such as used in usual production of semiconductor devices. In the case of glass, the multi-layered wiring substrate 6 can be manufactured also in the form of wafer like that in using glass and can be manufactured to have a square thin flat plate shape.

Figure 3:
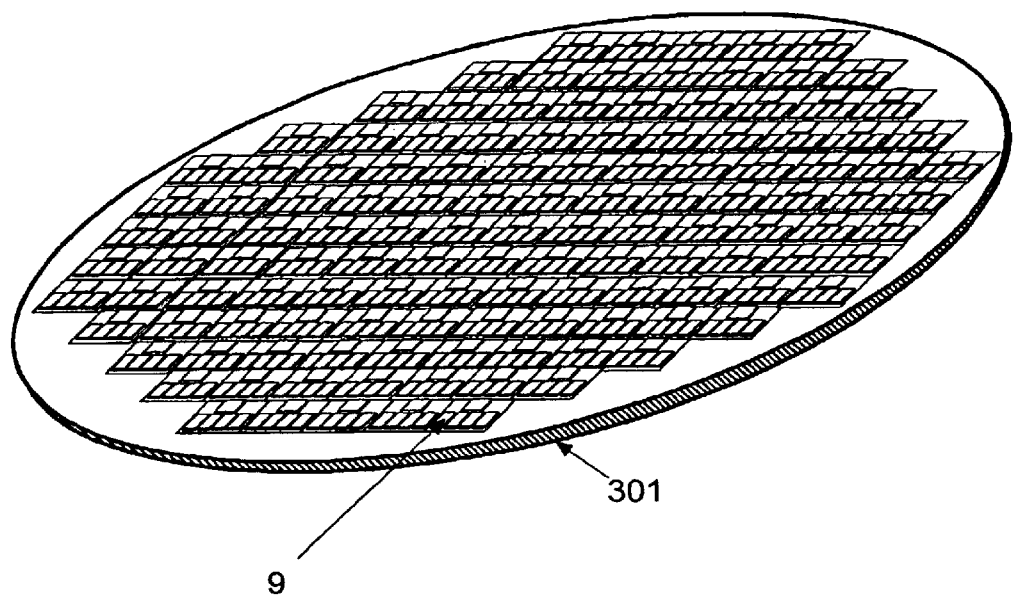
FIG. 3 is a perspective view showing a state of forming plural semiconductor modules on a silicon wafer.

FIG. 3 shows a state where plural modules are formed on a silicon wafer 301. Plural module circuits are formed on a silicon wafer predetermined semiconductor devices 9, resistors and capacitors are mounted thereon; external connection terminals, for example, solder balls are formed; and, optionally, resin is filled between the semiconductor device and the substrate. Subsequently, respective module portions are cut out individually to obtain desired semiconductor modules by the same method as the dicing method used for a silicon wafer.

Figure 4:
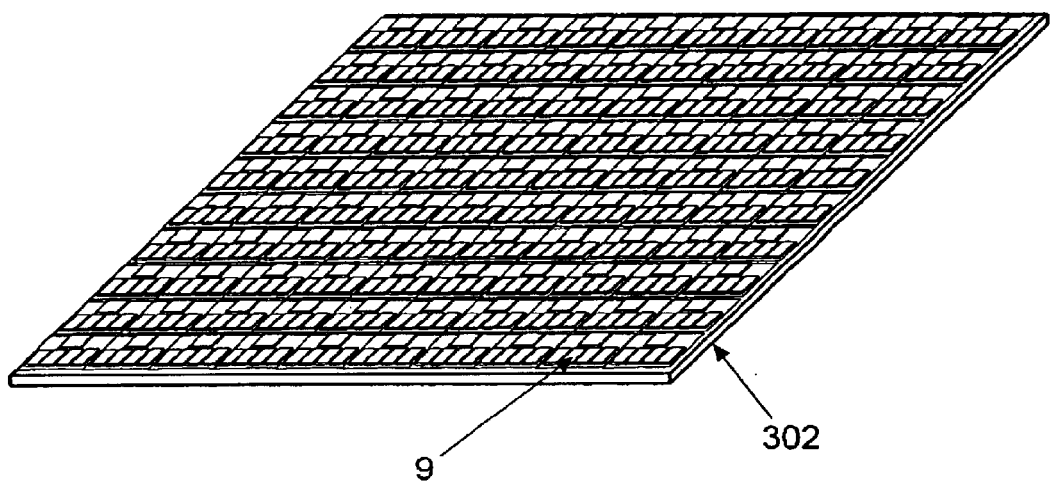
FIG. 4 is a perspective view showing a state of forming plural semiconductor modules on a glass substrate.

FIG. 4 shows a state of forming plural modules on a glass substrate 302. Also, in this case, plural module circuits are formed on the glass substrate; predetermined semiconductor devices, resistors and capacitors are mounted thereon; external connection terminals, for example, solder balls are mounted; and, optionally, resin is filled between the semiconductor devices and the substrate. Subsequently, respective module portions are cut out individually by the same method as the dicing method used for a silicon wafer to obtain desired semiconductor devices.

Successively, each of the constituent elements of the semiconductor module 1000 in this embodiment will be described.

As the substrate 1 (core substrate 1), a glass substrate, silicon substrate, ceramic substrate or glass epoxy substrate is used. The heat expansion coefficient of the glass substrate or the silicon substrate is from about 3 ppm/° C. to 5 ppm/° C., and since the heat expansion of the substrate is small compared with that of the ceramic substrate, fine wirings can be formed.

Further, since the heat expansion coefficient of the glass substrate or the silicon substrate is close to that of the silicon of the semiconductor device 9, the stress caused by the difference in heat expansion coefficients is small, and so connection can be ensured between the multi-layered wiring substrate 6 and the semiconductor device 9.

Particularly, when silicon is used as the substrate 1, since the heat expansion coefficient thereof is equal with that of the silicon of the semiconductor chip, thermal stress is not caused substantially between the semiconductor chip and the substrate 1 (multi-layered wiring substrate).

Further, when glass, for example, low alkali glass is used as the substrate 1, the heat expansion coefficient is about 5.0, which is smaller compared with that of existent ceramic substrates, and the heat expansion is also small. Further, the thermal stress caused between the semiconductor device and the insulation substrate (multi-layered wiring substrate) is also small. The glass substrate is available at a reduced cost compared with the silicon substrate. Further, since glass has an insulation property, when a glass substrate is used as the insulation substrate, it is not necessary to additionally form an insulation film when a conductive material is applied to the surface of the glass substrate or the inner surface of a through hole, or wiring is formed by plating or the like, which can simplify the manufacturing process.

The connection reliability between the semiconductor module 1000 and the mounting substrate 10 for mounting the same will be explained. The linear expansion coefficient of the mounting substrate 10 is about 10 to 20 ppm/° C., and it is about 15 to 18 ppm/° C. in a case of a glass epoxy substrate, which is the usual mounting substrate. Accordingly, when a glass substrate or silicon substrate is used as the insulation substrate 1, an insulation layer is necessary on the secondary side of the insulation substrate 1 for relieving the thermal stress formed between the semiconductor module 1000 and the mounting substrate 10. This will be described in more detail later.

Further, since the glass substrate or the silicon substrate has excellent smoothness compared with the existent ceramic substrate, a finer wiring pattern can be formed on the glass substrate or the silicon substrate than on the ceramic substrate. More specifically, the wiring pitch on the glass substrate or the silicon substrate is about 2 to 200 $\mu$m. If the wiring pitch exceeds 200 $\mu$m, the number of the wiring layers can not be decreased effectively. On the other hand, at the wiring pitch of less than 2 $\mu$m, the electrical resistance of the wiring is increased.

As described above, when the glass substrate or the silicon substrate is used for the substrate 1 (core substrate 1), since a fine wiring pattern can be formed on the substrate 1, the number of thin film wiring layers 2 on the substrate 1 can be made smaller than that of the existent ceramic substrate, and the entire multi-chip module can be made smaller (thinner). Further, when the number of thin film wiring layers 2 is small, since the wiring length from the semiconductor chip 9, such as an LSI, to the user's substrate 10 is shortened, so that signals can be sent and received at a higher speed.

The thickness of the insulation substrate 1 changes subtly also depending on the kind of insulation substrate 1 and the method used in forming the through holes, and it is desirably from 100 to 1000 $\mu$m, and, more preferably, about 300 to 500 $\mu$m. When the thickness of the insulation substrate 1 is 1000 $\mu$m or more, the fabrication cost for the through holes is increased, which is not practical. On the other hand, if it is 100 $\mu$m or less, a poor handling performance, such as conveyance in the substrate manufacturing process, results, and, in addition, the strength of the insulation substrate 1 is lowered when the through holes 100 are formed, in which case the substrate may possibly be damaged.

The substrate 1 has through holes 100 for interconnecting the wirings formed on both surfaces of the substrate and for maintaining a connection. The through hole 100 is formed by various methods depending on the kind of insulation substrate 1 being used. For example, the hole is formed by sand blasting, laser fabrication or photolithography. In the use of sand blasting, as shown in FIGS. 31(*a*) to 31(*e*), a film resistive to sand blasting is formed on the glass substrate (FIG. 31(*a*)), and windows are formed in the film by using photolithography (FIG. 31(*b*)) to form a mask. Subsequently, by blowing abrasive grains to the mask layer (FIG. 31(*c*)), through holes are formed while pulverizing glass at the windows on a minute unit (FIG. 31(*d*)). Subsequently, an insulation film 1 having through holes is formed by removing the mask (FIG. 31(*e*)).

When the through hole 100 is formed by sand blasting, since fine unevenness is present at the extreme wall surface of the through hole 100 based on the fabrication principle itself, a strong adhesion can be obtained for the wirings on the inner wall surface of the through hole 100. As a result, plated wirings can be formed precisely on the inner surface of the through hole 100 after forming an electric supply film.

Further, when the substrate 1 is a glass substrate, use of sand blasting is effective. When the through hole is formed in the glass substrate by using photolithography, it is necessary for the glass substrate to have light sensitivity, but light sensitive glass is expensive. On the other hand, since no light sensitivity is required for the glass substrate when the hole is formed by sand blasting, the cost is reduced and plural through holes can be formed at once. Accordingly, multi-chip modules can be mass produced at a low cost.

Figure 32:
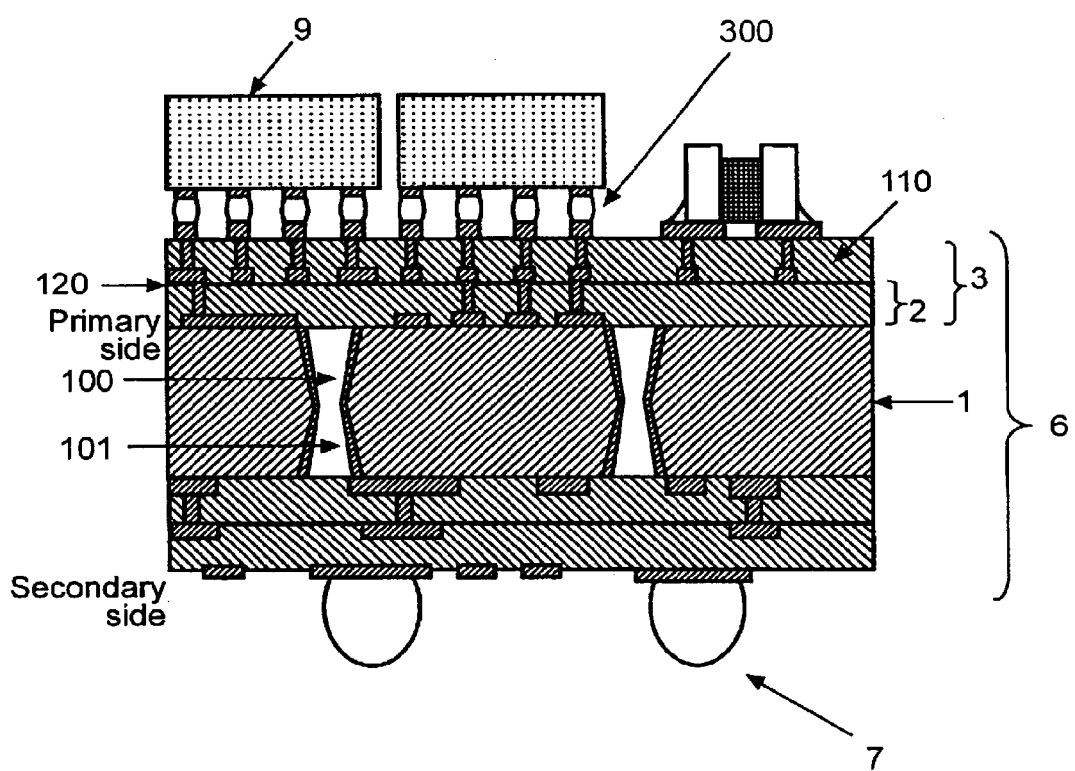
FIG. 32 is a cross-sectional view of a semiconductor module according to the another embodiment of this invention.

When the through hole 100 is formed by sand blasting, as also shown in FIG. 1, the diameter of the through hole 100 is often different between the one open end and the other open end. That is, the diameter of the through hole 100 is gradually decreased from the surface of the substrate at which sand blasting is started (fabrication start surface) to the other surface of the substrate (fabrication completion surface). As shown in FIG. 32, the shape of the through hole may be such that the diameter enlarges from the center in both directions to the outside of the insulation substrate by applying sand blasting from both surfaces of the substrate. In this case, since the time until the through hole is formed can be shortened compared with the case of opening the through hole from one side, the diameter of the through hole at the open end can be made smaller.

Figure 5A:
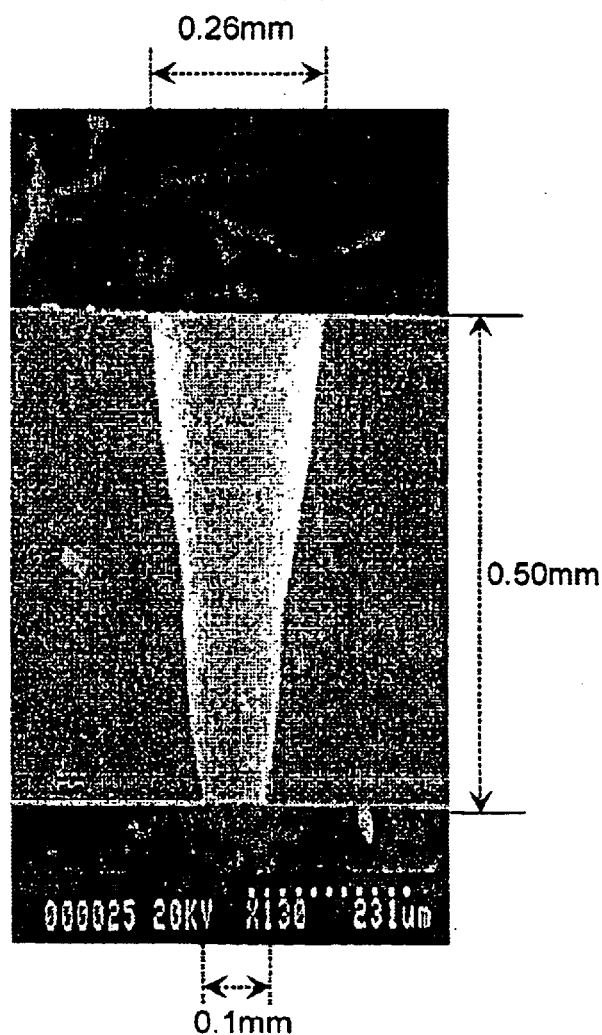
FIG. 5(a) is a microphotograph showing a view of a through hole formed by sand blasting in a glass substrate.
Figure 5B:
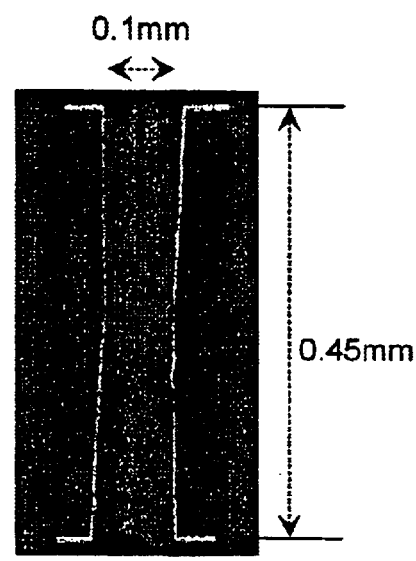
FIG. 5(b) is a microphotograph showing a view of a through hole formed by photo-etching in a glass substrate.

On the other hand, in the photoetching method or laser fabrication method, a through hole 101 of a substantially constant diameter tends to be formed. FIG. 5(*a*) shows a through hole formed by sand blasting, and FIG. 5(*b*) shows a through hole 101 formed by a photoetching method.

On the surface of the insulation substrate 1 where the diameter of the opening of the through hole 100 is smaller (primary side of the substrate), semiconductor devices 9 with a narrow pitch for connection terminals are mounted, while the mounting substrate 10 for mounting the semiconductor module is mounted at the surface where the diameter of the opening is larger (secondary side of the substrate) 2. This enables the wirings to be arranged at a narrower pitch on the primary side of the multi-wiring layer 3 on which the semiconductor devices 9 are mounted. That is, when the diameter for the opening of the through hole 100 on the primary side is made smaller, more wiring channels can be passed between each of the through holes, and, as a result, wirings can be extended with a lesser number of thin film wiring layers 2.

The diameter of the opening on the primary side is from 5 μm to 300 μm, more preferably, 10 μm to 100 μm, which is about 1/50 to about 1/5 times the thickness of the insulation substrate 1. On the other hand, the diameter of the opening of the through hole 100 on the secondary side is from 100 to 1000 pm, which is desirably 1/10 to 10 times the thickness of the insulation substrate 1. When the opening diameter on the secondary side exceeds about 10 times the thickness of the insulation substrate 1, the mechanical strength, for example, the flexural strength at that portion of the insulation substrate 1 cannot be maintained. On the contrary, when the opening diameter on the a secondary side is less than about 1/10 the thickness of the insulation substrate 1, since a tapered angle of 90 degrees, at least, 88 degrees, is necessary for forming the hole penetrating as far as the primary side, formation of the wirings to the wall surface of the through hole tends to be difficult. Further, less of the processing powder reaches the deep bottom of the hole, and, as a result, the rate of the sand blasting fabrication is retarded.

More preferably, the opening diameter on the secondary side of the through hole is 200 μm to 300 μm, which is about 2/5 times to about 1 time the thickness of the insulation substrate. For example, when the opening diameter of the through hole 100 on the secondary side is 250 μm, the layout of the wirings for interconnecting the wirings inside of the through holes and the solder bumps 7 is facilitated by the arrangement of solder bumps 7 in a zig-zag relation with respect to the through holes 100.

Figure 6:
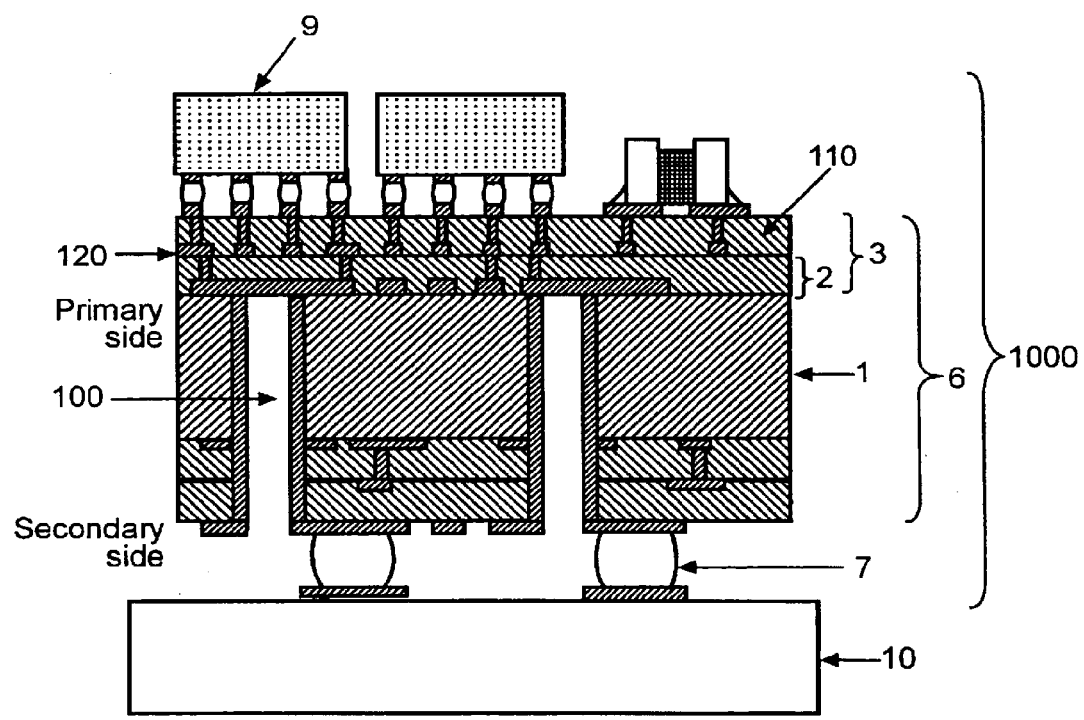
FIG. 6 is a cross-sectional view of a semiconductor module according to another embodiment of this invention.

However, the method of forming the through hole is not restricted only to sand blasting. FIG. 6 shows a multi-chip module using a multi-layered wiring substrate in which through holes are formed by fabrication other than sand blasting, for example, using laser or photolithographic fabrication.

In FIG. 1, conductive material is present on the inner surface of the through hole for enabling electrical connection between both surfaces of the insulation substrate 1. For example, copper wirings 101 are formed by forming an electric supply film, for example, Cr/Cu by sputtering or the like to the inner surface of the through hole 100 and then applying electric plating. After forming the wirings 101, an insulation material may be filled in the through hole to improve the strength of the substrate 1.

Further, as a method of establishing the electrical connection between both surfaces of the insulation substrate 1, a conductive material is filled in the through hole 100, for example, by paste printing in addition to formation of the wirings to the inner surface of the through hole 100. Alternatively, a solder material may be melted and cast into the hole. When a properly selected conductive material is filled in the insulation substrate 1, the strength of the insulation substrate 1 having the through holes 100 can be enhanced.

In this embodiment, wirings 120 and a thin film wiring layer 2 comprising an interlayer insulation layer 110, such as are made of polyimide or polybenzocyclobutene, are formed on the surface of the insulation substrate 1. Each of the interlayer insulation layers 110 (thin film wiring layer 2) requires a thickness capable of ensuring the wiring insulation between the layers and between the wires, which ranges from about 5 to 50 μm, and, more preferably, about 10 to 20 μm.

Physical values for each of the interlayer insulation layers 110, for example, the heat expansion coefficient and modulus of elasticity are not identical and may be changed optionally by varying the kind of materials and the compositional ratio for the material. The physical values of the interlayer insulation layer are made closer to the physical values of the semiconductor device (silicon) on the primary side of the multi-layered wiring substrate 6 on which the semiconductor devices 9 are mounted, while the physical values of the interlayer insulation layer are made closer to the physical value of the mounting substrate.

For example, on the primary side of the multi-layered wiring substrate 6 on which the semiconductor devices 9 are mounted, the interlayer insulation layer is formed with a material of a small linear expansion coefficient. Since this makes the linear expansion coefficient closer between the primary side of the multi-layered wiring substrate 6 and the semiconductor device 9, the thermal stresses to be formed can be reduced to ensure the connection reliability. This is particularly effective when the heat expansion coefficient of the substrate 1 and the heat expansion coefficient of the semiconductor device (silicon) are different.

On the other hand, on the secondary side of the multi-layered wiring substrate 6, the interlayer insulation layer is formed with a material having a large linear expansion coefficient. Since this can make the linear expansion coefficient on the secondary side of the multi-layered wiring substrate 6 and that of the substrate for mounting (mounting substrate 10) closer, the thermal stresses produced between the multi-chip module 1000 and the mounting substrate 10 can be decreased to ensure the connection reliability.

By changing the linear expansion coefficient along the direction of the thickness of the multi-layered wiring substrate 6, thermal stresses formed between the semiconductor device 9 and the multi-layered wiring substrate, as well as between the multi-chip module and the mounting substrate 10, can be relieved to ensure the connection reliability.

It is not necessary, to change the material of the internal insulation layer on both the primary side and the secondary side of the multi-layered wiring substrate, but the material only for the interlayer insulation layer on the secondary side, where the difference of the linear expansion coefficient is large between the substrate 1 and the mounting substrate 10, may be changed to make the linear expansion coefficient closer to that of the mounting substrate.

Successively, the kind of insulation substrate 1 and the difference in the heat expansion coefficient of the interlayer insulation layer 110 will be described. The heat expansion coefficient of a resin, such as polyimide or polybenzocyclobutene, used for the interlayer insulation layer is several tens ppm/° C., whereas the heat expansion coefficient of the silicon substrate is about 3 ppm/° C. and the heat expansion coefficient of the glass substrate is about 5 ppm/° C. when used as the insulation substrate 1, respectively. Accordingly, thermal stresses are formed between the insulation substrate 1 and the multi-layered wiring layer 3 (thin film wiring layer 2), so that the multi-layered wiring substrate 6 warps or distorts due to the thermal stresses, thereby possibly reducing the connection reliability in the multi-chip module. In addition, formation of fine wirings on the interlayer insulation layer is difficult. When the thickness of the insulation substrate is adjusted to about 30 times to 50 times the thickness of the interlayer insulation layer 110, warping of the multi-layered wiring substrate 6 can be suppressed.

In FIG. 1, two thin film wiring layers 2 are formed on the surface of the insulation substrate 1 on the side where the diameter of the opening of the through hole 100 is smaller (primary side), and thin film wiring layers 2 are formed on the side where the diameter of the opening of the through hole 100 is larger (secondary side). However, the number of thin film wiring layers 2 formed on both surfaces of the insulation substrate 1 is optional and can be set freely in accordance with the design of the semiconductor module. Further, on the secondary side of the insulation substrate 1, only the layer for relieving the stress caused between the multi-chip module and the substrate for mounting the module (stress relaxation layer) may be formed without forming the interlayer insulation layer.

The thin film wiring layer 2 may be laminated layer by layer. For example, a wiring pattern is formed on the insulation substrate 1 and then the interlayer insulation layer 110 is formed. In this case, the wiring density can be increased by utilizing photolithography and forming wirings by a semi-additive plating process. Further, the wirings may also be formed by other methods, such as screen printing. Then, a wiring pattern is formed optionally on the thus formed interlayer insulation layer 110 and an interlayer insulation layer is formed again. The method of forming the wirings may be different between the primary side and the secondary side of the insulation substrate. That is, since semiconductor chips are mounted on the primary side of the insulation substrate 1, a wiring pattern of a narrow pitch is required. On the other hand, since the secondary side of the insulation substrate is connected to a mounting substrate (user's substrate), a not so narrow pitch as on the primary side is required. Accordingly, on the primary side, requiring a narrow pitch, the wirings may be formed by using photolithography and plating, and on the secondary side they may be formed by printing.

It is preferred to predetermine the role of the wirings for each layer of the thin film wiring layer 2 in the multi-layered wiring substrate 6. For example, in the thin film wiring layer 2 comprising two layers on the primary side in FIG. 1, the wirings formed just above the insulation substrate 1 (first wirings) may be formed as signal wiring for sending/receiving signals between the user's substrate and the semiconductor devices 9, and the second wirings formed over the first interlayer insulation layer 110 may be formed as signal wirings for power source lines or ground lines, and the third wirings formed on the second interlayer insulation layer 110 may be formed as sending/receiving signals flowing between the semiconductor devices 9 (LSI) to each other. By constituting the multi-layered wiring layer 3 with at least a two layered structure, three wiring layers can be formed, thereby making it possible to separate the signal wirings between the semiconductor device 9 and the user's substrate 10, the signal wirings between the semiconductor devices 9 to each other, and the power supply wirings or ground wirings, which can form high speed and fine wiring patterns, and also provide an effect for the prevention of noise in the signals. It will be apparent that all the wirings for sending/receiving signals between the semiconductor devices 9 (LSI) to each other are not necessarily formed on the second layer interlayer insulation layer, but it may suffice that wirings for sending/receiving signals between each of the semiconductor device 9 (LSI) are applied more frequently on the uppermost surface of the multi-layered wiring substrate than other wiring layers.

Alternatively, when a power source line or a ground line is formed by the wirings formed just above the insulation substrate (first wirings), and a signal line for sending/receiving signals between the user's substrate and the semiconductor devices 9 and a signal line for sending/receiving signals between the semiconductor devices 9 (LSI) to each other are arranged together and formed in the second wirings formed as the first interlayer insulation layer 110, the multi-layered wiring layer 3 can be formed as a single layer.

Whether the multi-layered wiring layer 3 may be formed as a single layer or two or more layers is determined depending on the logic scale of the semiconductor device 9 and the layout therefor, or the required high speed signal characteristics.

Further, it is effective to change the wiring width or the wiring shape in a case where the role of the wirings formed in each of the interlayer insulation layers is changed.

Semiconductor devices 9, such as an LSI, are mounted on the primary side of the multi-layered wiring substrate 6. The semiconductor devices 9 usable herein may include BGA, CSP and wafer level CSP, as well as lead type semiconductors, such as QFP and TSOP.

Figure 7:
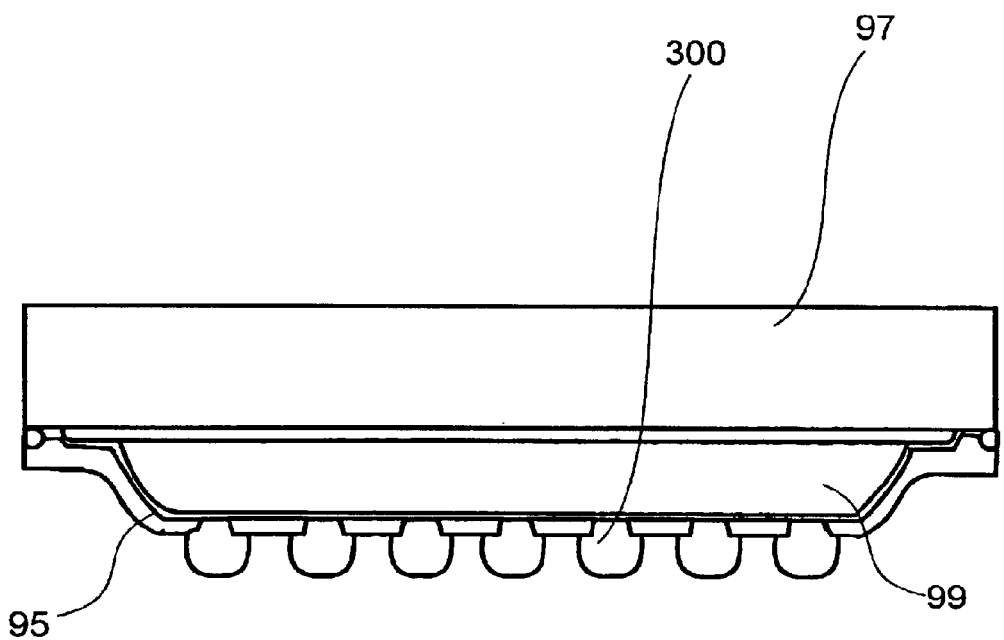
FIG. 7 is a diagram of a semiconductor device having a stress relaxation layer.

The semiconductor devices 9 and the passive components are desirably of a surface mount type. In this embodiment, since the thermal stress caused between the substrate 1 and the semiconductor device 9 is made smaller, any under fill (resin) between the semiconductor device and the substrate 1 is no longer necessary. Accordingly, in the case of the surface mounting, for the production of MCM having plural chips, this facilitates a test conducted to determine whether the chips operate properly or not and replaces only failed chips that are judged to be defective. As shown in FIG. 7, when the semiconductor device 9 itself has a layer 99 for relieving the stress caused between the semiconductor device and the substrate for mounting the same, underfill is particularly unnecessary to facilitate repair of the defective chip. In FIG. 7, wirings 95 connected electrically with an electrode of a wafer 97 on which the device circuit is formed are connected with bumps 300 exceeding the slope of a stress relieving region.

Figure 8:
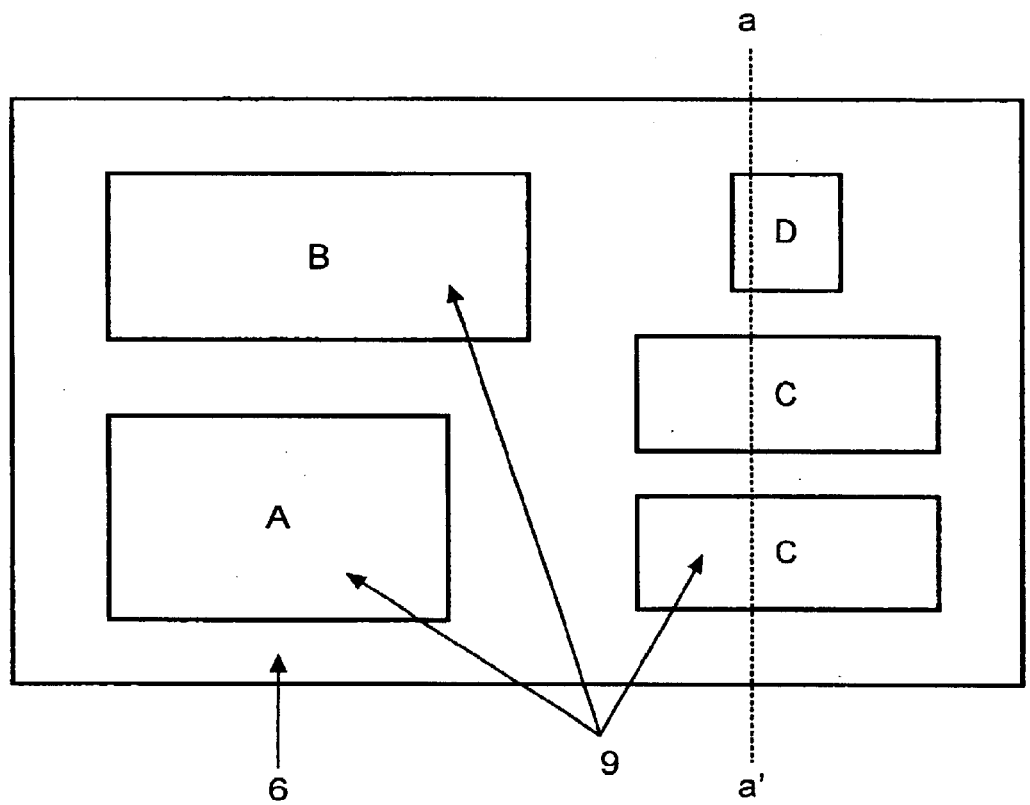
FIG. 8 is a diagram showing an example of the layout of a combination of semiconductor chips mounted on a multi-layered substrate.

The semiconductor chips 9 to be mounted are not restricted only to the same identical kind, but, for example, as shown in FIG. 8, plural different kinds of semiconductor chips may be mounted on the multi-layered wiring substrate 6. For example, a combination of a microcomputer A, a flash memory B, a DRAM C, an identical part, such as capacitor D may be provided, as seen in FIG. 8. Alternatively, plural semiconductor chips having a different operation voltage can be used in combination. Further, one or more of semiconductor packages, such as PFP or CSP, or a passive part, such as resistors or capacitors, may be contained thereon.

In the case of mounting different kinds of semiconductor chips on the multi-layered wiring substrate 6, wirings necessary for connecting different semiconductor chips are formed at the uppermost layer of the multi-wiring layer 3, and the ground wirings or signal wiring are formed in the lower wiring layer. Further, only the wirings required for electrical connection with respect to the user's substrate may be connected finally through the through hole 100 in the insulation substrate 1.

A combination of different semiconductor chips may include, for example, DRAM and microcomputer; DRAM, microcomputer and DSP, ;DRAM, microcomputer and ROM; DRAM and flash memory; DRAM, SRAM and flash memory; and ASIC and DRAM. For example, in a car navigation system, a combination of a flash-incorporated microcomputer, ASIC and DRAM is used. In a digital still camera or digital video camera, a combination of flash-incorporated microcomputer and DRAM, or a combination of microcomputer, flash memory and DRAM is suitable. While the flash memory is used for reducing the power consumption, a highly integrated DRAM is combined in a case where the memory capacity is insufficient only with the flash memory. Chips may be laminated optionally. While the same constitution as the digital still camera is used in portable terminals, for example, portable telephones, since lower power consumption is required in the portable telephone than in the digital still camera, the capacity of the flash memory is often set equal to or greater than the capacity of the DRAM.

The semiconductor device 9 (semiconductor chip) and the multi-layered wiring substrate 6 are connected to each other by way of external connection terminals, such as bumps 300. For example, connection is made by mounting semiconductor devices 9 having bumps 300 to the multi-layered wiring substrate 6 and subjecting them to reflow. Further, when the bumps 300 are previously formed to the multi-layered wiring substrate 6, so-called bare chips (not packaged semiconductor devices) can be mounted to the multi-layered wiring substrate.

For the bump 300, a wire material, such as gold, formed by a supersonic bonding device into a convex shape, or an alloy formed by mixing metals such as tin, lead, copper, silver, bismuth, zinc and indium alone or as a mixture of two or more of them can be used as the solder bump 300. Further, a resin blended with a conductive material such as silver or gold can also be used as the bump 300. The solder bump 300 can be formed also by blending fine solder particles with a material comprising rosin or the like, printing the blend on an electrode of a semiconductor device using an appropriate mask and then heating the same to a temperature equal to or higher than the melting point of the solder, thereby melting the solder.

The bump can be formed also in the case of using resin blended with conductive particles by a method of printing the pasty resin material described above on the electrode of a semiconductor device by using an appropriate mask into a hardened or semi-hardened state by heating. Further, the bump can be formed also by removing an oxide layer on the surface of the electrode, coating a flux having an appropriate adhesion on the electrode, arranging balls each of an appropriate grain size on the electrode by using a mask or the like and heating them to a temperature equal to or higher than the melting point of the solder by a reflow furnace or the like. Naturally, they can be applied also to the formation of the external connection terminal 7.

As the electrode disposed to the semiconductor device 9 to be connected with the bump 300, it is possible to use an electrode made of aluminum or copper formed by a step referred to as a pre-step, or an electrode formed after conducting re-wiring using copper wirings or the like from the electrode, such as a wafer level CSP, after the pre-step to the surface of the semiconductor device. By applying a surface treatment with nickel or gold on the surface of the electrode, it is possible to improve the wettability between the bump and the electrode surface, or prevent lowering of the bonding strength between the bump and the electrode portion caused by the diffusion of the bump material into the electrode in the heating step, such as mounting a semiconductor module on an external substrate to be described later.

When the external connection terminal 300 is a solder bump, a so-called lead free solder such as Sn—Ag series, or Sn—Ag—Cu series, for example, Sn-3.0Ag-0.5Cu may be used as the solder. Further, Bi and In may be incorporated taking the wettability of the solder into consideration.

However, since the lead free solder is harder compared with the conventionally used lead solder, it is difficult to moderate the thermal stress caused between the semiconductor device 9 and the multi-layered wiring substrate 6 with the solder bump.

Then, as in this embodiment, the physical property value of the interlayer insulation layer, for example, the heat expansion coefficient or the modulus of elasticity, is changed along the direction of the thickness of the multi-layered wiring substrate. Specifically, the connection reliability between the semiconductor device 9 and the multi-layered wiring substrate 6 can be ensured even in the case of using lead free solder by making the heat expansion coefficient closer between the interlayer insulation layer at the uppermost surface on the primary side and the semiconductor chip 9 mounted on the multi-layered wiring substrate 6, thereby reducing the thermal stress to be formed. Further, when a glass or silicon substrate is used for the insulation substrate, the thermal stress formed is decreased and the connection reliability can be ensured between the semiconductor device 9 and the multi-layered wiring substrate 6 even in a case of using lead free solder.

The melting point of the solder bump used for the connection on the primary side has to be higher than that of the ball 7 used for the connection on the secondary side. That is, it is necessary to provide a temperature gradation between the primary side and the secondary side by changing the solder connecting temperature.

For example, it is desirable to use a high temperature type solder for the primary connection between the semiconductor device and the multi-layered wiring substrate and a low temperature type solder for the secondary connection between the multi-chip module and the mounting substrate 10.

External connection terminals 7 are formed on the secondary side of the multi-layered wiring substrate 6 for establishing the connection relative to the mounting substrate 10 (user's substrate 10). In the same manner as the bump 300, the external connection terminal 7 may also be constituted, in addition to the solder ball, for example, with a resin blended with conductive particles. Depending on the connection method with the external substrate, it may be used without forming the ball or the terminal.

When a solder bump is formed as the external connection terminal 7, the distance between the adjacent bumps (bump pitch) is 500 $\mu$m to 800 $\mu$m and the diameter for the bump 7 is properly selected in accordance with the bump pitch and the diameter of the bump is about 70% of the bump pitch at the maximum.

When the external connection terminal 7 comprises a solder bump, a so-called lead free solder such as Sn—Ag series, or Sn—Ag—Cu series, for example, Sn-3.0Ag-0.5Cu may be used as the solder. Further, Bi and In may be incorporated taking the wettability of the solder into consideration.

As described above, since lead free solder is harder compared with the conventionally used lead solder, it is difficult to moderate the thermal stress caused between the multi-chip module and the mounting substrate 10 with the solder bump.

However, the connection reliability between the multi-chip module and the mounting substrate 10 can be ensured even in the case of using lead free solder by changing the heat expansion coefficient of the interlayer insulation layer of the multi-chip module along the thickness direction of the multi-layered wiring substrate, thereby relieving the stress. The multi-layered wiring substrate 6 in this embodiment serves not only as an interposer of the semiconductor chip, but also relieves thermal stress formed between the semiconductor device 9 (semiconductor chip, LSI and the like) and the multi-layered wiring substrate 6, and the mounting substrate 10.

Figure 9:
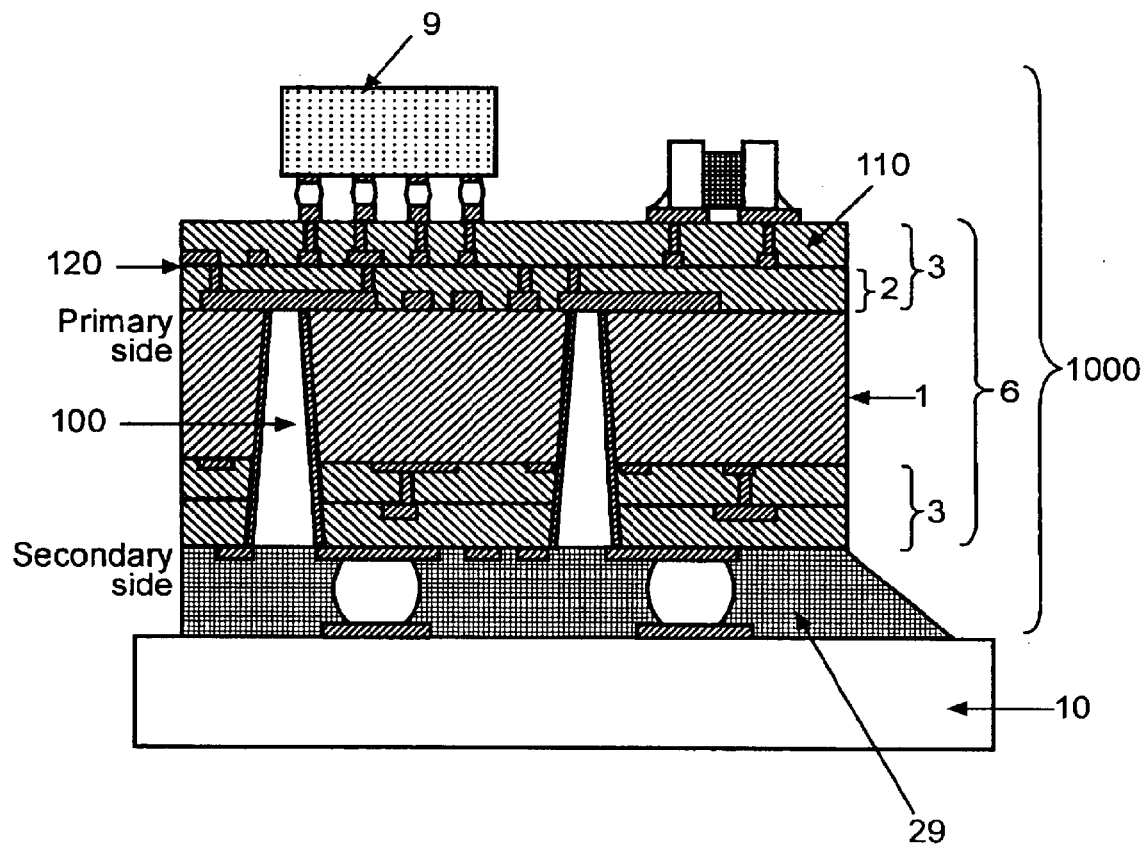
FIG. 9 is a cross-sectional view of a semiconductor module according to another embodiment of this invention.

As shown in FIG. 9, also in the semiconductor module described in this embodiment, when a user desires a higher reliability, an underfill 19 (resin) may of course be formed between the semiconductor module and the mounting substrate. The resin used as the underfill comprises epoxy resin, phenol resin and silicone resin alone or as a mixture of two or more of them, which may be blended optionally with a filler such as silicon dioxide or aluminum oxide, coupling agent, colorant or flame retardant.

Figure 10:
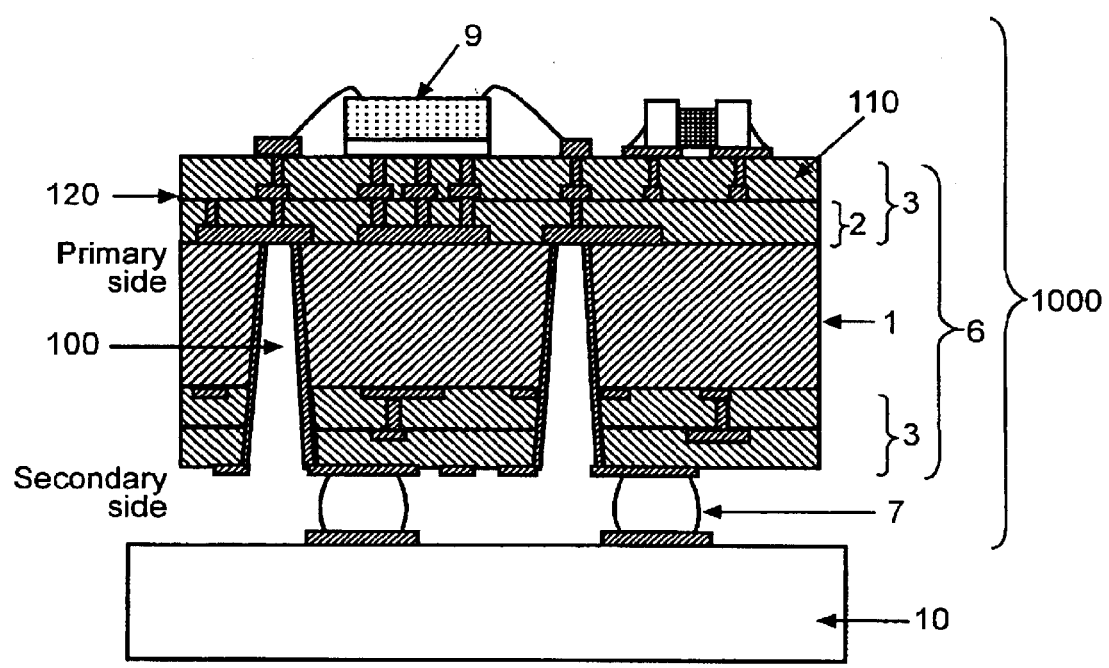
FIG. 10 is a cross-sectional view of a semiconductor module according to another embodiment of this invention.
Figure 11:
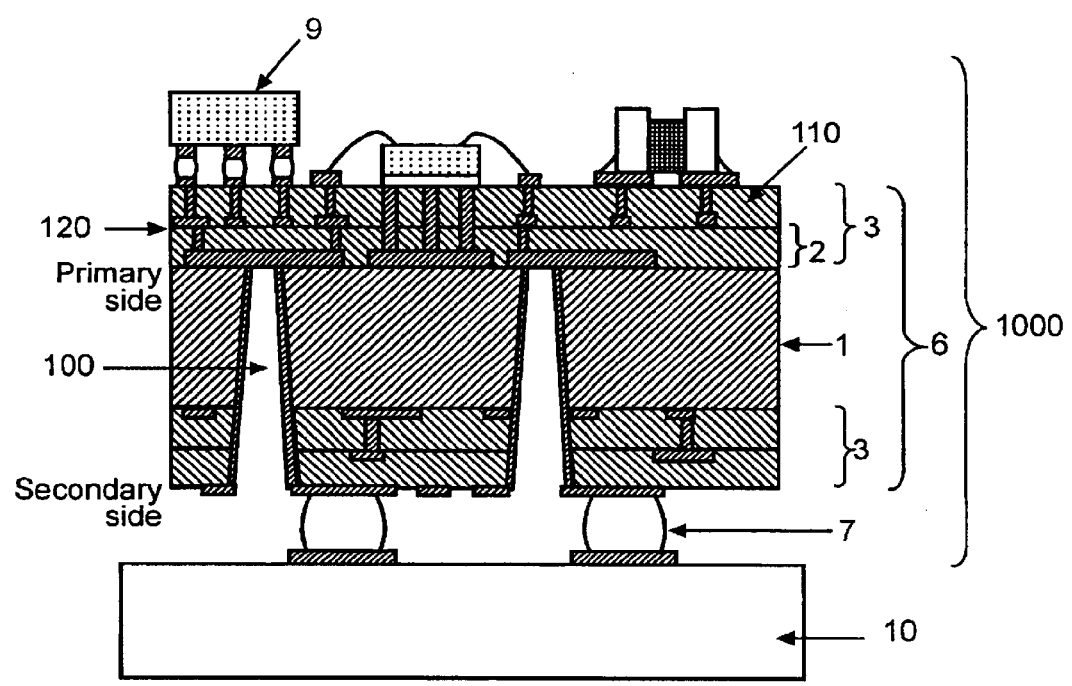
FIG. 11 is a cross-sectional view of a semiconductor module according to another embodiment of this invention.
Figure 12:
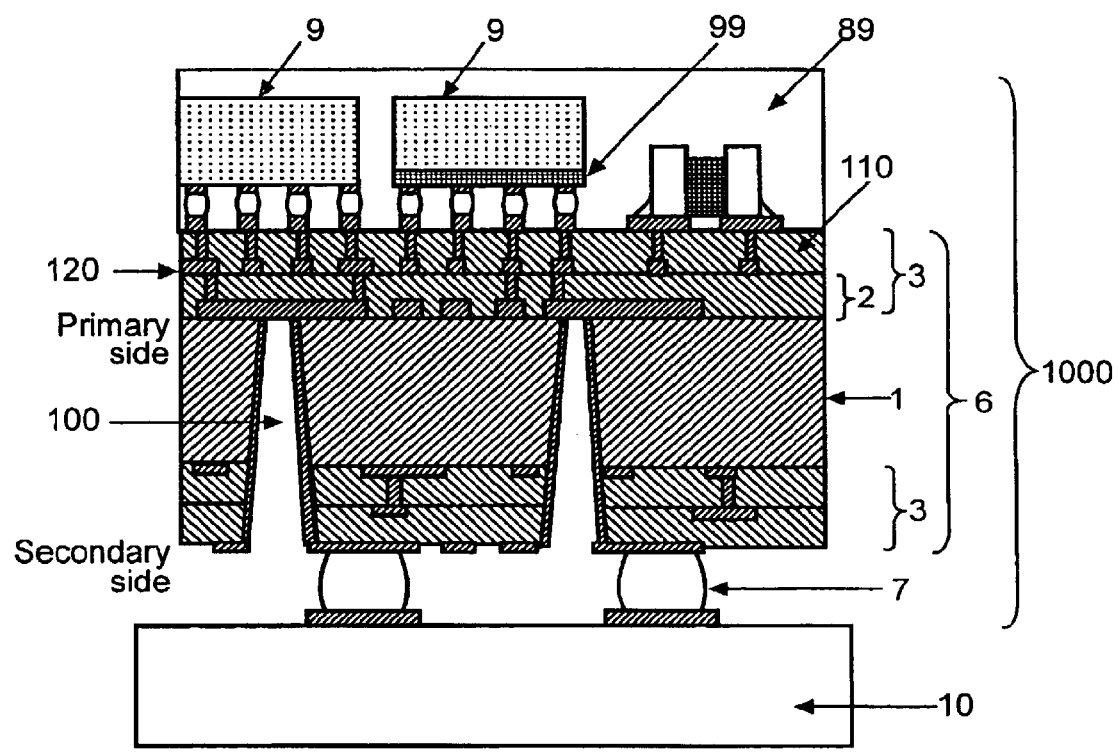
FIG. 12 is a cross-sectional view of a semiconductor module according to another embodiment of this invention.

In addition, as shown in FIG. 10, the semiconductor device 9 (semiconductor chip) and the multi-layered wiring substrate 6 may be connected to each other, not by flip chip connection, but by wire bonding. As shown in FIG. 11, flip chip connection and wire bonding connection may be present together in the semiconductor module having a plurality of semiconductor chips 9, depending on the kind of semiconductor chip or the like.

In the case of using wire bonding, since heat generation of the semiconductor device 9 occurs mainly from the rear face thereof, heat can be dissipated through the multi-layered wiring substrate 6 by die bonding the semiconductor device 9 to the multi-layered wiring substrate 6. The electrode of the semiconductor device 9 and the electrode of the multi-layered wiring substrate 6 are connected to each other by wire bonding. The reliability can of course be improved further by optionally covering the semiconductor device 9 with a resin 89 (resin molding) or inserting an underfill between the semiconductor device 9 and the multi-layered wiring substrate.

As the effect of this embodiment, since the multi-layered wiring substrate has a function of relieving the stress, the connection reliability can be improved between the semiconductor chip and the wiring substrate for mounting the semiconductor chip, and between the multi-chip module constituted with them and the mounting substrate.

Further, since the multi-layered wiring substrate has a function of relieving the stress, when the multi-chip module is mounted on the mounting substrate, the stress between the multi-chip module and the user's substrate can be moderated to mitigate the user's operation, even if the underfill is not provided.

Further, when a glass substrate or a silicon substrate having through holes is used as an insulation substrate, wirings can be formed at a high density on the insulation substrate. Further, since the number of the thin film wiring layers can be decreased, the multi-layered wiring substrate can be formed thin to reduce the thickness and the size of the semiconductor module.

Further, electric equipment mounted with a multi-chip module, for example, portable terminals such as portable telephones, personal computers, car navigations devices, digital/analog cameras, or video cameras can be made smaller in the size and higher in performance.

Further, since this is a multi-chip module, set manufacturers as users have so far purchased semiconductors, such as memories and microcomputers, individually, conducted layout design, such as for the extension of wirings, and mounted the semiconductors on the external substrate (circuit substrate) based on a given design. However, if a semiconductor module capable of attaining a predetermined function can be provided, the user can handle the semiconductor module as one component, which drastically decrease the design burden. This is particularly effective in the field of adding a new function or up-version for the function every several months, for example, in portable telephones or portable information terminals.

In the case of using a glass substrate for the substrate 1, a suitable glass composition can include, for example, soda glass, low alkali glass, non-alkali glass and ion strengthened glass, and it is selected properly while taking the modulus of elasticity or linear expansion coefficient into consideration. For example, the linear expansion coefficient generally tends to be decreased as the alkali ion content in the glass is lower.

In view of the improvement in the connection reliability between the semiconductor device 9 and the multi-layered wiring substrate 6, the non-alkali glass or low alkali glass is preferred. However, in the embodiment, since the connection reliability between the semiconductor device 9 and the multi-layered wiring substrate 6 depends not only on the characteristic of the glass material, but also on the selection for the connection structure between them or the underfill material, the glass material is selected, while also taking them into consideration.

On the other hand, in view of the connection reliability for the entire semiconductor module 1000, soda glass of higher alkali content is preferred. This is because the difference of linear expansion coefficient is small between the multi-layered wiring substrate 6 and the mounting substrate 10 for mounting the same. However, since the connection reliability between the multi-layered wiring substrate 6 and the mounting substrate 10 depends not only on the characteristic of the glass material, but also on the material and the structure of the stress relaxation layer (thickness, area or the like) disposed on the surface of the multi-layered wiring substrate 6, the glass material is selected also taking these factors into consideration.

For allowing a difference in the thermal expansion coefficient between the semiconductor device 9 and the multi-layered wiring substrate 6, and a difference in the thermal expansion coefficient between the multi-layered wiring substrate 6 and the mounting substrate for mounting the same to be compatible, and also in view of the cost, low alkali glass at an alkali ion content between soda lime and non-alkali glass is preferred.

Figure 13:
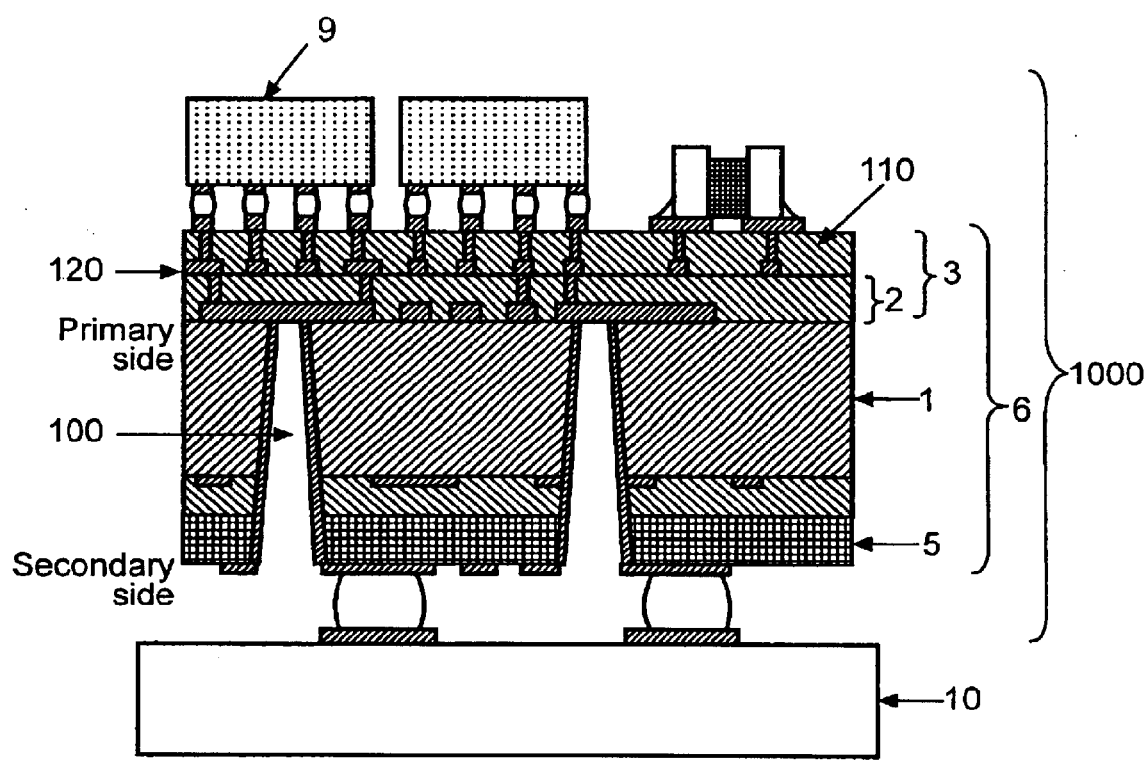
FIG. 13 is a cross-sectional view of a semiconductor module according to another embodiment of this invention.

Another embodiment of the multi-chip module according to this invention will be explained with reference to FIG. 13. In this embodiment, an insulation layer 5 for relieving the stress formed between the multi-chip module and the mounting substrate 10 (hereinafter referred to as a stress relaxation layer 5) is formed on the secondary side to be mounted to the mounting substrate 10 (user's substrate).

The thickness of the stress relaxation layer 5 is preferably of about $\frac{1}{10}$ to about $\frac{1}{2}$ relative to the thickness of the insulation substrate 1, or about $\frac{1}{300}$ to about $\frac{1}{20}$ relative to the diagonal length of the insulation substrate in view of the stress relaxation, but it is desirably about 10 to 200 $\mu$m and, further preferably, about 35 to 150 $\mu$m in view of the manufacturing process. The thickness and the physical property value of the stress relaxation layer will be described later in more detail.

Figure 14:
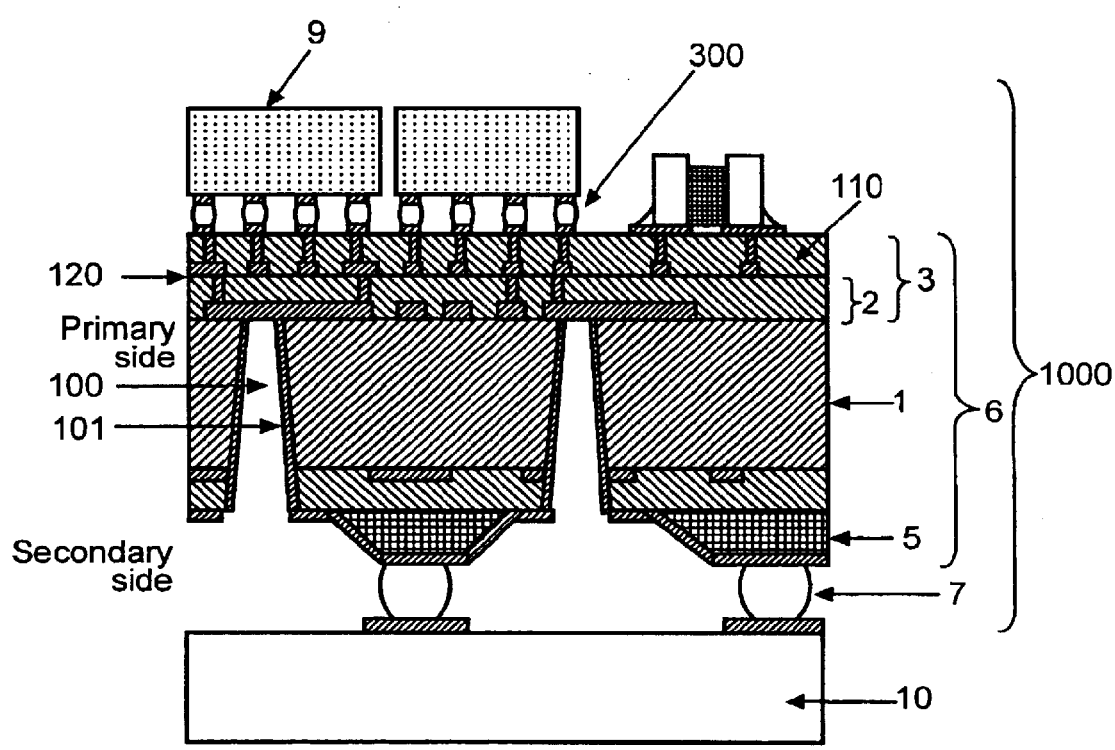
FIG. 14 is a cross-sectional view of a semiconductor module according to another embodiment of this invention.

The stress relaxation layer 5 is formed on the insulation substrate 1 or by using a mask by screen printing and spray coating, calendar coating, or photolithography may also be used. For example, when the stress relaxation layer 5 is mask printed (screen printed), the stress relaxation layer can be formed at any desired position. Further, the stress relaxation layer may be formed with a slanted portion at the end. Depending on the material of the stress relaxation layer, the slant portion may not be formed or the angle of the slant portion can be controlled. As shown in FIG. 14, when a stress relaxation layer is disposed at a portion of the substrate where the through hole is not formed and an external connection terminal is formed on the stress relaxation layer, the stress exerted on the external connection terminal can be relieved more efficiently.

On the other hand, when the stress relaxation layer is formed by stamping, since an insulation material for stress relaxation is coated on a stamping die and the shape of the stress relaxation layer is transferred onto the substrate, it is possible to select the insulation material such that no configurational change is caused at the end upon hardening of the insulation material. In this case, there is a feature that the shape at the end tends to be defined as a constant compared with the printing method.

Further, in the spray coating system, since a printing mask or stamping die is not used, there is a degree of freedom for the shape upon forming the stress relaxation layer, and a stress relaxation layer which is difficult to be formed by the printing mask or stamping die can be formed by properly selecting the nozzle shape. In addition, the thickness of the stress relaxation layer can be adjusted by controlling the blowing amount compared with the printing system or the stamping system, and the range for adjusting the thickness is extended.

In a method of appending a semi-hardened or not yet hardened resin sheet, since a thick stress relaxation layer can be formed and a previously sheeted insulation resin is used, such method provides an advantage in that the surface of the stress relaxation layer has excellent flatness.

It is of course possible to not use the method alone, but in combination for forming the stress relaxation layer.

Since it is necessary to establish electrical connection also between both surfaces of the stress relaxation layer 5 like that of the insulation substrate 1, a through hole 100 may be formed also in the stress relaxation layer 5. The through hole 100 may be formed not only by sand blasting, but also by laser processing or photoetching.

According to this embodiment, the stress caused by the difference in the thermal expansion coefficient between the semiconductor module 1000 for mounting the semiconductor chip 9 and the mounting substrate 10 can be relieved. In particular, in a case where the substrate 1 is made of a glass substrate or a silicon substrate, the stress caused on the secondary side of the substrate can be relieved efficiently.

Figure 15:
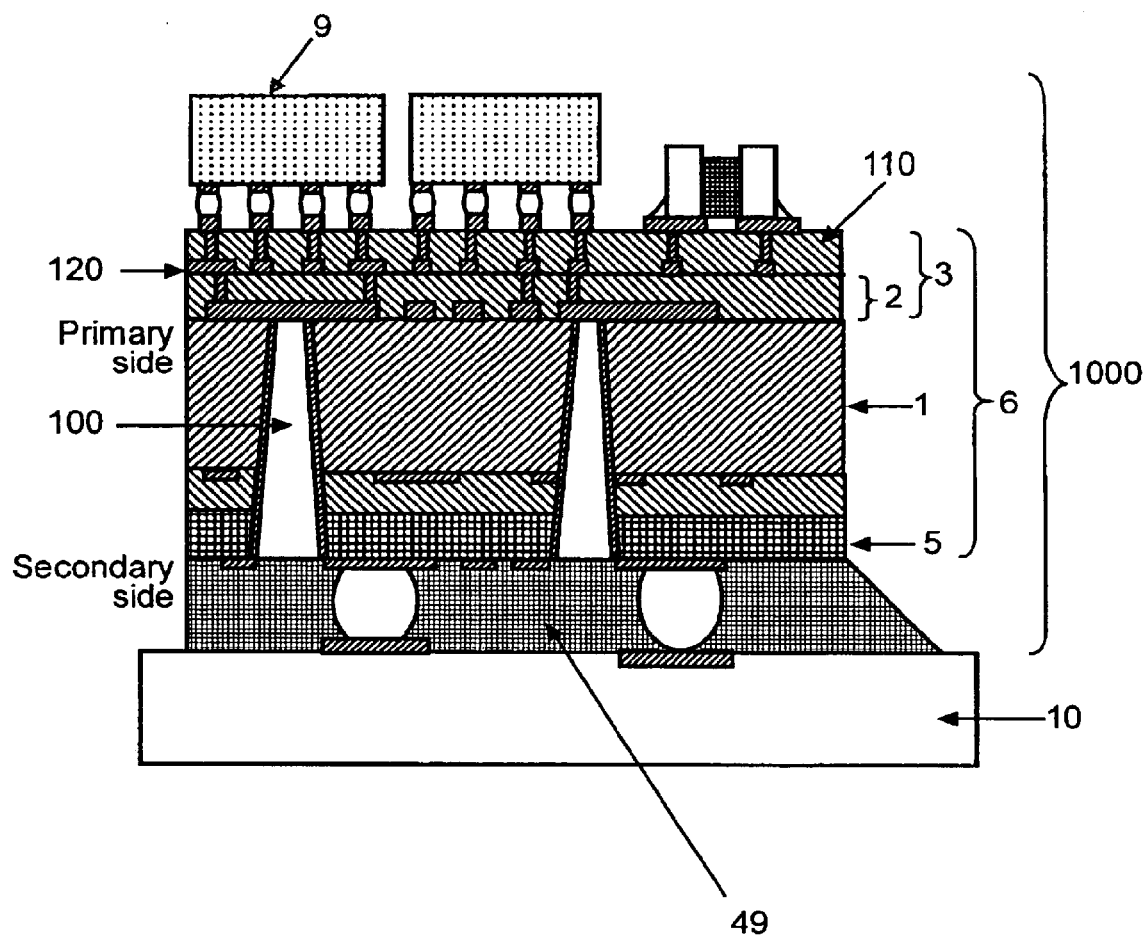
FIG. 15 is a cross-sectional view of a semiconductor module according to another embodiment of this invention.

Further, if the thermal stress formed between the semiconductor module 1000 and the user's substrate 10 can be relieved, the underfill needs not be provided when the semiconductor module 100 is mounted on the user's substrate 10, to mitigate the user's operation. Also, in the semiconductor module formed with the stress relaxation layer 5, the underfill can of course be used, as shown in FIG. 15, when a user desires a high reliability.

The stress relaxation layer 5 is not an essential constitution for the multi-layered wiring substrate 6, and there is no requirement for forming the stress relaxation layer 5 in the multi-layered wiring substrate 6 so long as the thermal stress caused by the semiconductor module 1000 and the user's substrate 10 is within an allowable range.

Figure 16:
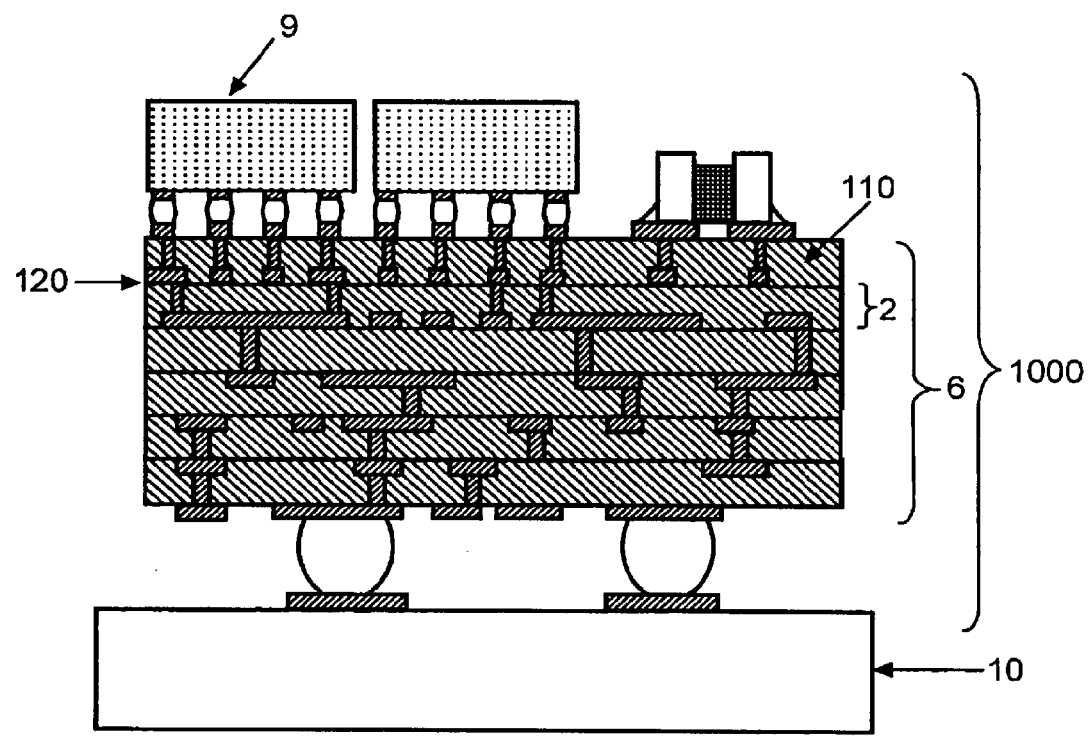
FIG. 16 is a cross-sectional view of a semiconductor module according to another embodiment of this invention.

FIG. 16 is a view of a multi-chip module according to another embodiment of this invention. In this embodiment, the multi-layered wiring substrate 6 has no substrate 1 as the core, and thin film wiring layers of different linear expansion coefficient are laminated. In such a structure, the thermal stress between the semiconductor device 9 and the mounting substrate 10 can be relieved by the multi-layered wiring substrate to ensure the connection reliability, and, further, the thickness of the insulation substrate 1 as the core substrate of the multi-layered wiring substrate can be saved, so that a multi-layered wiring substrate of a further reduced thickness can be attained. Accordingly, a thin film electronic device can be realized by using such multi-layered wiring substrate.

Figure 17:
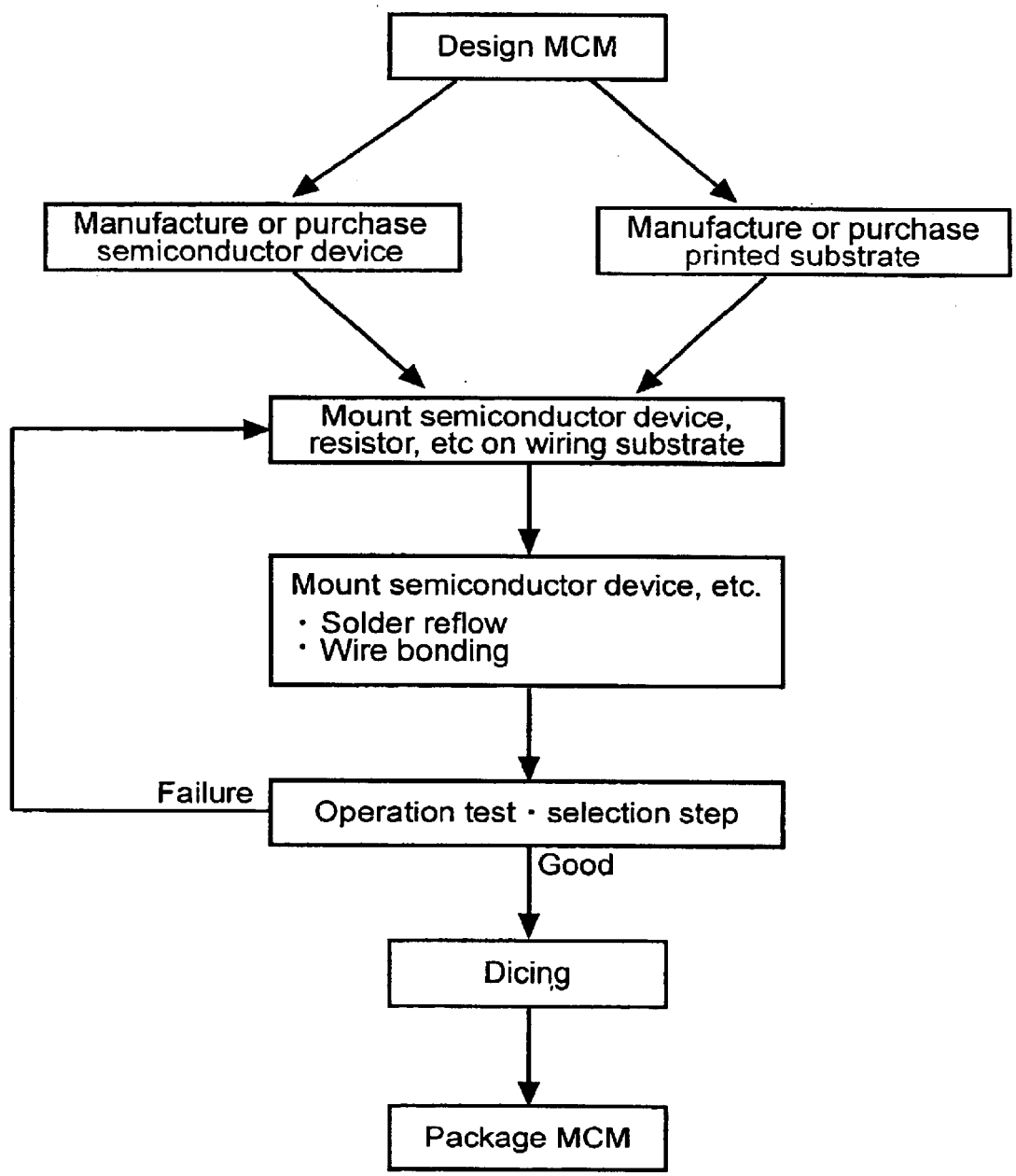
FIG. 17 is a flow chart showing an example of a manufacturing process for a semiconductor module according to this invention.

Successively, an embodiment of a method of manufacturing a multi-chip module will be explained with reference to FIG. 17.

At first, a multi-chip module is designed in compliance with a user's requirement or the like.

Successively, semiconductor devices (semiconductor chips) used for the multi-chip module are provided. The semiconductor chips may or may not be a semiconductor package in which re-wirings and solder bumps are formed on a semiconductor wafer after the completion of the so-called pre-step by the formation of device circuits and then subjected to dicing (so-called wafer level chip size package). Further, the semiconductor chips are not always restricted to those manufactured by the module manufacturer per se, but may also be semiconductor chips purchased from other manufacturers, as required. It is desirable if the semiconductor chips per se have passed an operation test.

Further, a wiring substrate (interposer) for mounting the semiconductor chips is also prepared. Again, the wiring substrate may be manufactured by the module manufacturer per se or purchased from other manufacturers. The wiring substrate is the wiring substrate explained in the embodiment described above, in which the substrate 1 (core substrate 1) may be a glass substrate or a silicon substrate, and a thin film wiring layer 2 may be formed on the surface of the substrate 1, or a layer for relieving the stress may be disposed on the secondary side of the substrate 1 (core substrate 1). It is also desirable that the wiring substrate itself has passed the test, for example, for detecting a wiring short circuit.

The wiring substrate may be a substrate before dicing to a size of the multi-chip module as the final product. In the case of the wiring substrate before dicing, as shown in FIG. 3 or FIG. 4, plural semiconductor chips are mounted on the wiring substrate and semiconductor chips are mounted by solder reflow or wire bonding.

Subsequently, electrical connection is established between the semiconductor chip and the wiring substrate, and an operation test is conducted for good/failure determination. In the operation test, when the characteristic or compatibility between the semiconductor chips (for example memory and microcomputer) are poor, instead of regarding the entire multi-chip module as a defective product, at least one chip may be replaced and the operation test may be conducted again for good/failure determination. When defective products are found, the number of chips replaced is optional.

After conducting the judging step to select good and defective products finally as the multi-chip module, dicing is performed to form multi-chip modules, and then they are shipped. It is of course possible to mount the thus manufactured multi-chip modules to other mounting substrates, incorporate them into electronic parts or electronic equipments and market them as information terminal equipment. The operation test for the multi-chip module may be conducted after dicing.

A user purchasing the semiconductor module (multi-chip module) that is provided with a predetermined function can handle the semiconductor module as one part and mount the same by using external connection terminals such as bumps to manufacture desired electronic equipment.

According to the manufacturing method of this embodiment, since the operation test between each of the semiconductor chips of the multi-chip module can be conducted in a state in which the underfill is not provided between the multi-layered wiring substrate and the semiconductor device, if a defective module is found, replacement on every defective chip is possible on the wafer (glass wafer, silicon wafer). Accordingly, the manufacturing yield for the multi-chip module can be improved.

Further, since the multi-layered wiring substrate has a function of relieving stress, when the multi-chip module is mounted to the mounting substrate, the stress between the multi-chip module and the user's substrate can be relieved even if the underfill (resin) is not provided to mitigate a user's operation.

Successively, an example of a method of manufacturing a multi-layered wiring substrate 6 and a semiconductor module 1000 will be explained.

In this embodiment, a thick insulation layer as a stress relaxation layer is formed on a glass or silicon substrate, serving as a substrate 1 (sometimes also referred to as a core substrate 1 or an insulation substrate 1), and a through hole is formed in the insulation layer by sand blasting.

In the case of using glass or silicon as the substrate 1, the multi-layered wiring substrate 6 can be manufactured in the form of a wafer or the substrate can be manufactured in the form of a square thin plate shape.

FIG. 3 and FIG. 4 show a state of preparing plural pieces together by using a glass substrate or a silicon substrate. Plural module circuits are formed on the glass substrate or silicon substrate, on which predetermined semiconductor devices (semiconductor chips), resistors and capacitors are mounted, solder balls as external connection terminals are mounted, and a resin is filled optionally between the semiconductor devices and the substrate. Subsequently, by the same method as the dicing of a silicon wafer, respective module portions can be cut out individually to obtain desired semiconductor devices. In the following, an explanation will be made with respect to a structure for a portion of the multi-layered wiring substrate and the multi-chip module for facilitating the explanation.

Figure 18:
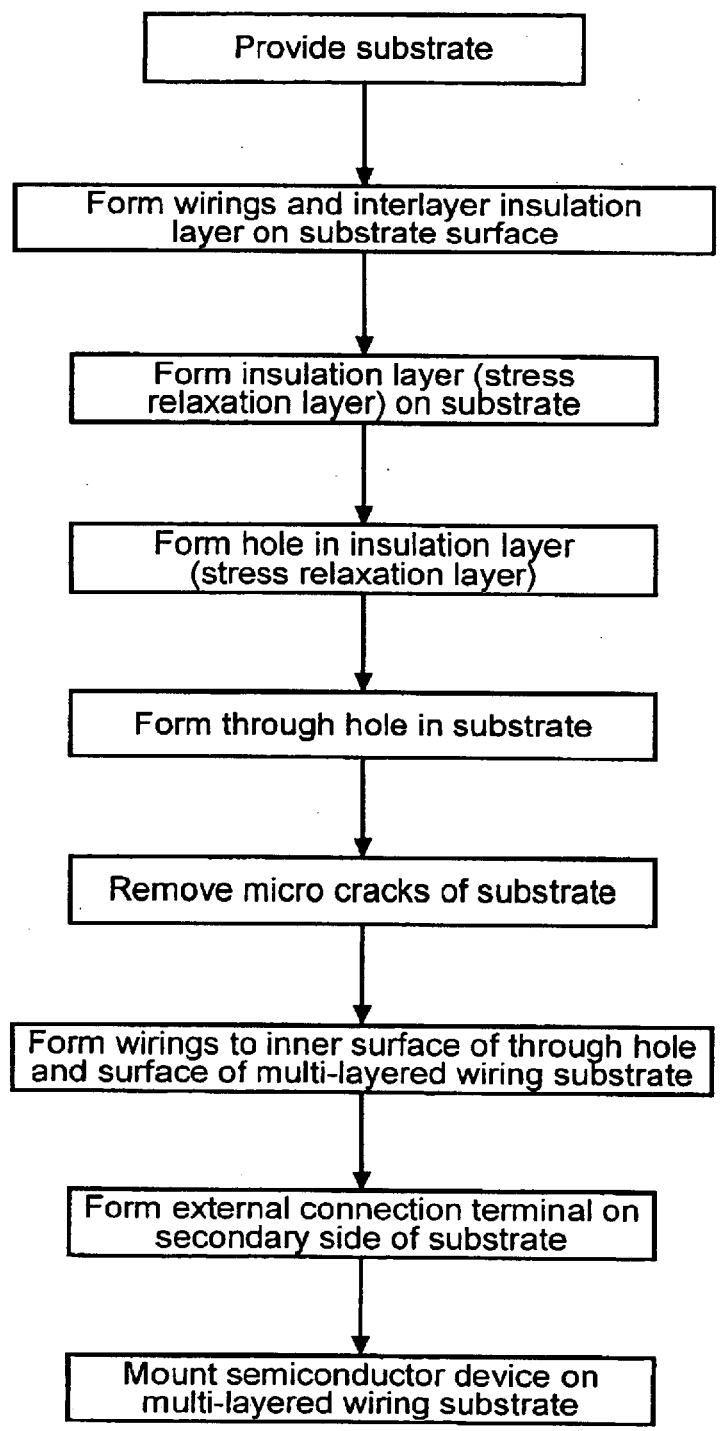
FIG. 18 is a flow chart showing another example of a manufacturing process for a semiconductor module according to this invention.

FIG. 18 is a flow chart of a manufacturing method according to this embodiment. This embodiment includes a step of forming external connection terminals (secondary side bumps 7) on the secondary side of the multi-chip module, but the secondary bumps may not always be formed in the case of shipping and selling the product as a multi-chip module. Further, in this embodiment, the use of a glass substrate or a silicon substrate as the substrate 1 will be explained.

FIGS. 19(a) to 19(c), FIGS. 20(a), 20(b) and FIGS. 21(a), 21(b) show successive steps in the method of manufacturing a multi-chip module.

At first, a glass substrate or a silicon substrate is provided as an insulation substrate 1 for use in a wiring substrate. If necessary, surface conditioning or cleaning is conducted to the surface or the end face, and failure in view of manufacture can be reduced by applying an appropriate end face processing.

Since the silicon material itself is conductive (semiconductor-conductor), when it is used as the substrate 1 (insulation substrate 1), it is necessary to form an insulation layer on the surface. Such a layer can include, for example, a thermal oxide layer that can be formed on the surface by heating in steam or an organic resin layer. In FIG. 19(a) to FIG. 21(b), an insulation layer formed on the surface, in the case of a silicon substrate, is indicated integrally as an insulation substrate 1.

Figure 19A:
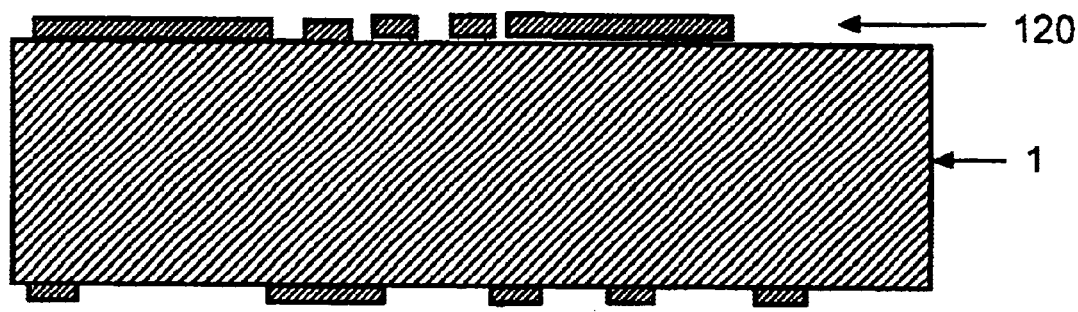
FIGS. 19(a) to 19(c) are cross-sectional views showing steps in the process of manufacture of a semiconductor module according to this invention.

Then, as shown in FIG. 19(a), wirings 120 are formed on the surface of the semiconductor substrate 1. For forming the wirings, a semi-additive method can be used, for example. When the wirings are formed by the semi-additive method, the surface of the insulation substrate 1 is preferably cleaned by sputter etching or the like before forming the plated layer. This can ensure the adhesion between the substrate surface and the wirings. In view of the conductivity of the wiring material, Cu, Al, Ag or Au is preferred and Cu is desirable in view of the corrosion resistance, migration resistance and the cost. Since Cu is a ductile material, it can be used also as a mask for sand blasting.

Figure 19B:
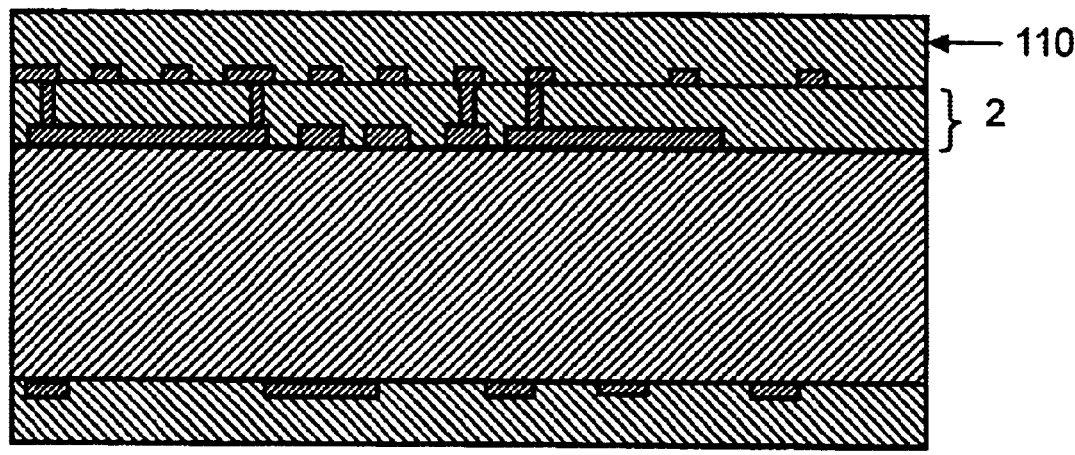

Successively, as shown in FIG. 19(b), an interlayer insulation layer 110 is formed on the wiring pattern. The thickness of the interlayer insulation layer 110 ranges from about 5 to 50 μm, preferably, from about from 10 to 20 μm. As the interlayer insulation layer 110, a polyamide resin, polyimide resin, polybenzocyclobutene resin or polybenzoxazole resin can be used. When a thin film wiring layer 2 is formed layer by layer on the insulation substrate 1, the number and the thickness of the thin film wiring layer can be changed depending on the requirement. By utilizing the layer by layer formation of each of the layers, it is also possible to improve the electric characteristics of the wirings by controlling the thickness of the wiring layer, the thickness of the interlayer insulation material and the material. For instance, the degree of electrical connection between the ground layer and the signal layer and between the signals layers themselves can be controlled by using materials of different dielectric characteristics for the insulation material of the insulation layers between the ground layer and the signal layer and the insulation material B between the wires of the signal layers, which makes it possible to cope with high speed wirings. Further, by changing the material for each of the interlayer insulation layers, the linear expansion coefficient can be changed along with the thickness of the substrate.

FIG. 19(b) shows an example in which two wiring layers are formed on the surface of the insulation substrate 1 on which the semiconductor chips are mounted (primary side) and a single wiring layer is formed to the surface where the semiconductor module is mounted (secondary side).

Figure 22A:
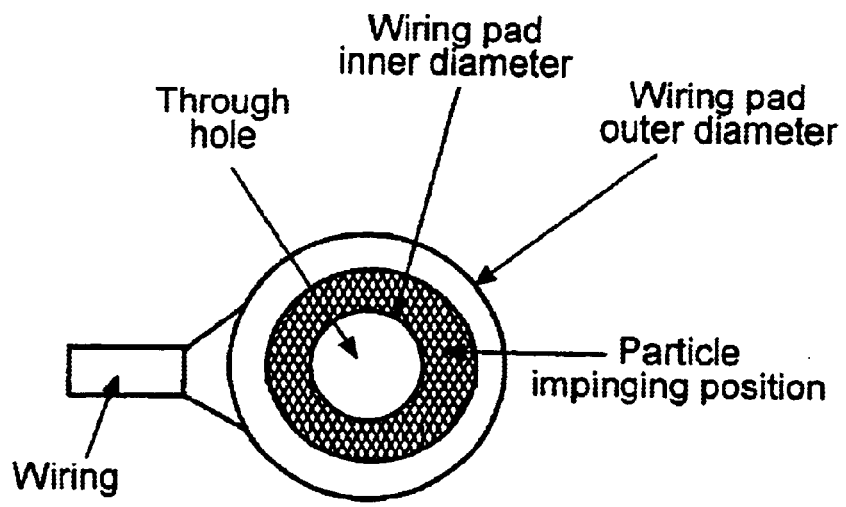
FIG. 22(a) is a plan view and FIG. 22(b) is a cross-sectional view illustrating a relation between wirings and a position at which sand blasting particles impinge.
Figure 22B:
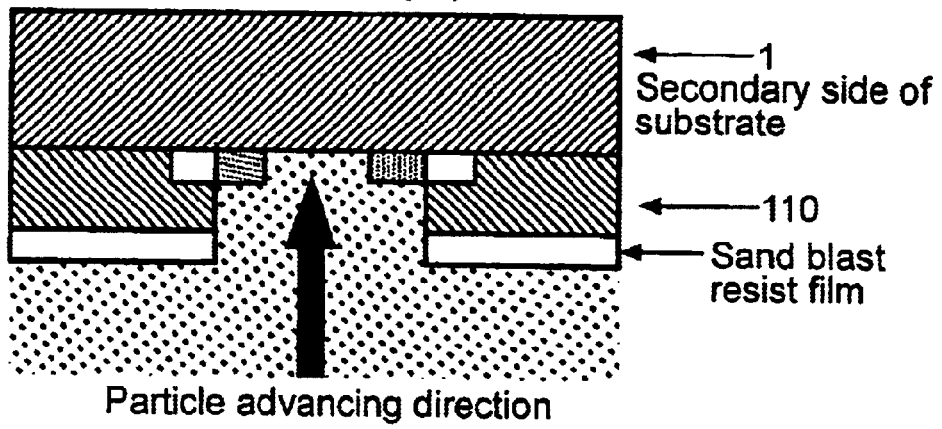
Figure 30A:
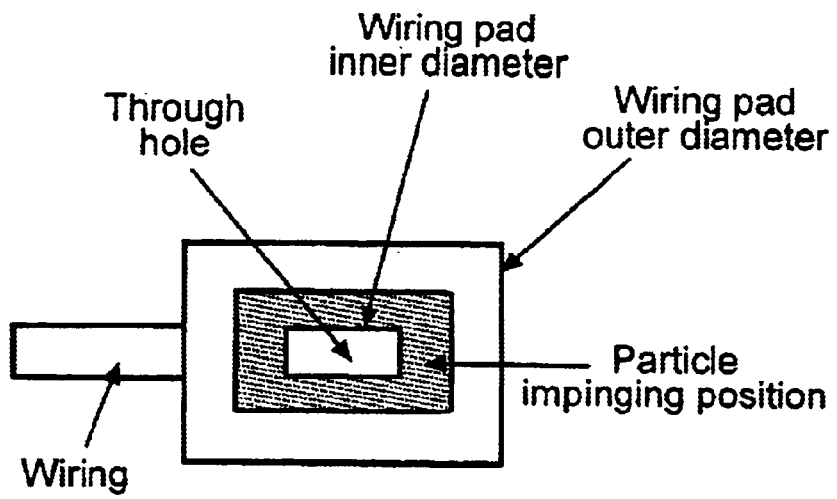
FIG. 30(a) is a plan view and FIG. 30(b) is a cross-sectional view illustrating a relation between wirings and a position at which sand blasting particles impinge.
Figure 30B:
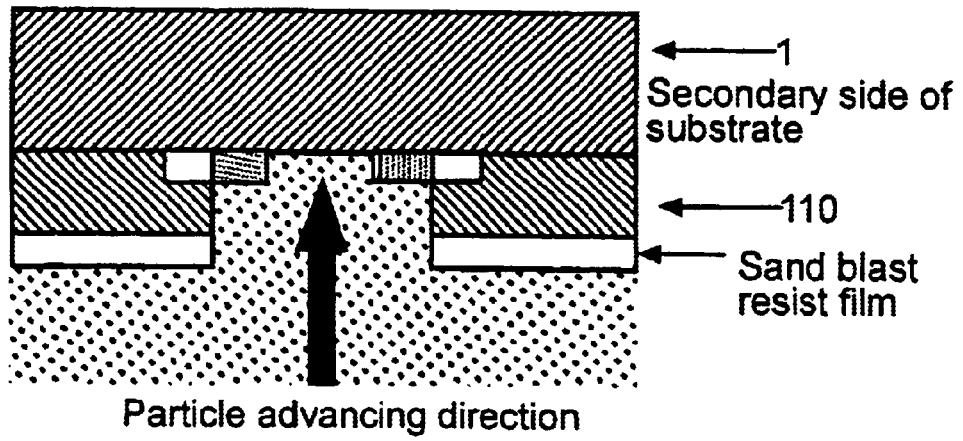
Figure 31A:
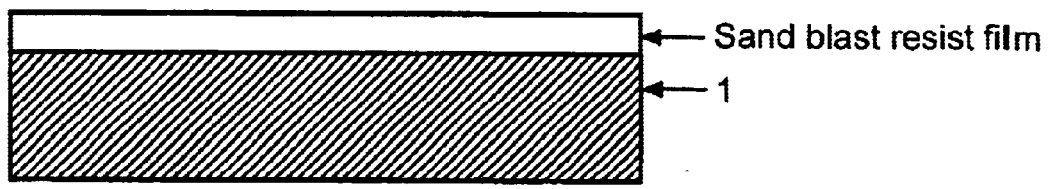
FIGS. 31(a) to 31(e) are cross-sectional views showing steps in the formation through holes in a substrate using a sand blasting method.
Figure 31B:
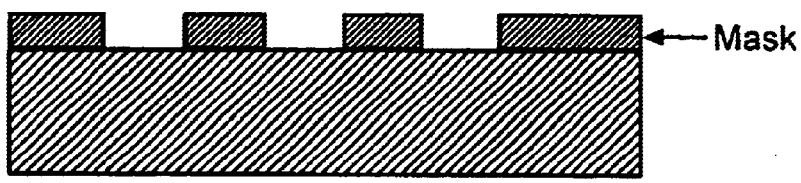
Figure 31C:
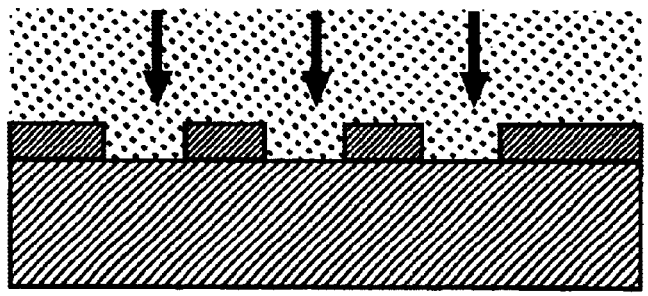
Figure 31D:
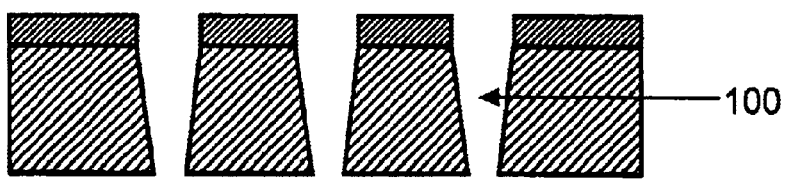
Figure 31E:
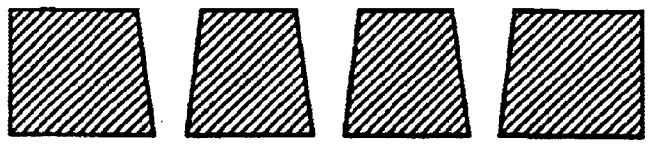

FIG. 22(a) shows a wiring pattern on the secondary side of the insulation substrate 1. In the portion of a pad shown in FIG. 22(a) and FIG. 30(a), an area where abrasive grains impinge upon sand blasting is shown by a hatched line. By previously disposing a copper pad so as to surround the position where the through hole 100 is formed, micro-cracks caused by sand blasting to the surface of the insulation substrate 1 can be suppressed to maintain the strength of the insulation substrate.

Figure 19C:
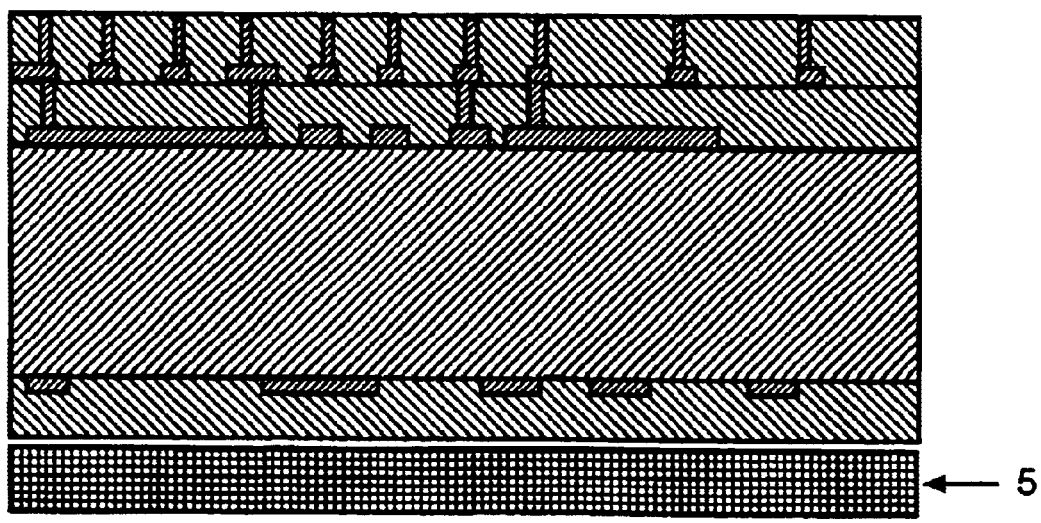

Successively, in FIG. 19(c), a thick insulation layer 5 is formed on the surface of the insulation substrate 1 where the semiconductor module is mounted to a user's substrate (secondary side), for example, by stencil printing or photolithography. The insulation layer 5 serves as a stress relaxation layer which can relieve the thermal stress caused by the difference of the linear expansion coefficient between the semiconductor module and the mounting substrate 10. When it is intended to form the insulation layer at a predetermined position with a high accuracy, there is adopted a method, for example, of applying screen printing by using a stencil mask and then applying laser trimming.

Figure 20A:
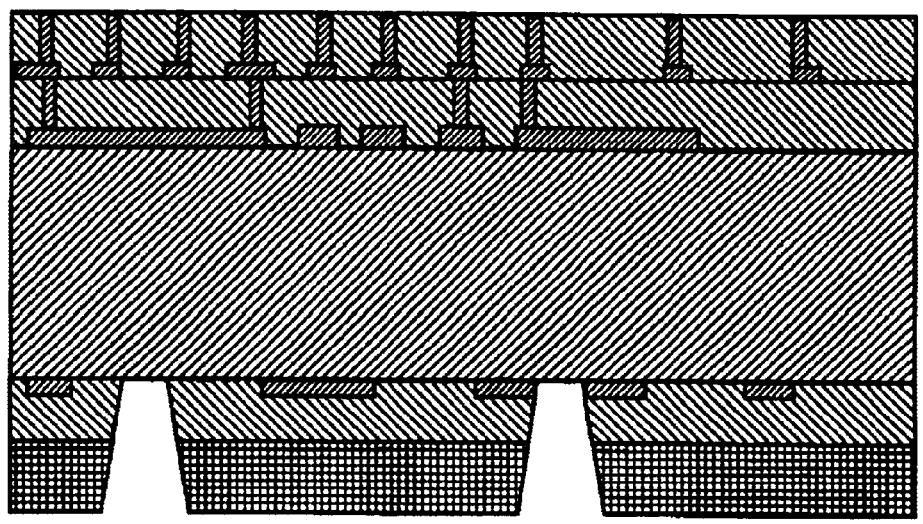
FIGS. 20(a) and 20(b) are cross-sectional views showing steps in the process of manufacture of a semiconductor module according to this invention.

Then, through holes 100 for connecting wiring layers on both surfaces of the insulation substrate 1 are formed by the steps of FIG. 20(a) and FIG. 20 (b). In this case, since the property of the material (hardness) is different between the stress relaxation layer 5 and the insulation substrate 1, it is difficult to form the through hole 100 in the stress relaxation layer 5 by sand blasting. Accordingly, a hole (concave) is formed to the stress relaxation layer by laser processing or the like, and then the through hole 100 is formed in the insulation substrate 1 by sand blasting.

A typical example of the method of forming a mask for forming the through hole 100 in the multi-layered wiring substrate 6 will be described below. The first method is a method using photolithography. Specifically, a blast resist as a mask upon sand blasting is formed on the stress relaxation layer and the blast resist and the stress relaxation layer are apertured by photolithography. The apertured blast resist forms a mask for forming the through hole in the stress relaxation layer by sand blasting. In this method, both the blast resist and the stress relaxation layer can be apertured together. However, it is conditioned that both of the blast resist and the stress relaxation layer are made of a light sensitive material.

The second method is a method of using laser processing. Specifically, a blast resist is formed on the stress relaxation layer in the same manner as the first method and then the blast resist and the stress relaxation layer are apertured together by laser processing. The second method can be applied irrespective of the light sensitivity of the blast resist and the stress relaxation layer. Further, since the resolution characteristic is not always necessary for the blast resist used in the second method, a material of more excellent blast resistance can be selected compared with the first method.

In the third method, a photosensitive blast resist is formed on the stress relaxation layer in the same manner as in the first method and an apertured pattern is formed in the blast resist by photolithography. Then, the stress relaxation layer is etched through the aperture of the blast resist to form a hole (concave) in the stress relaxation layer 5.

The blast resist requires a heat resistance and sand blasting resistance and it is formed by a method, for example, of (1) coating a photosensitive resin having sand blasting resistance on a thin film wiring layer 2 or (2) appending a photosensitive resin having a sand blasting resistance in the form of a dry film. Depending on the aperture diameter and the aperture pitch of the through hole and the positional accuracy thereof, the mask pattern can be formed also by screen printing. In this case, the positional accuracy and the fabrication accuracy can be finely controlled by optional additional processing using photolithography or laser processing.

A shape as shown in FIG. 20(a) is obtained by one of the first to third methods described above, in which the convex portion formed therein may or may not reach the insulation substrate 1.

Figure 20B:
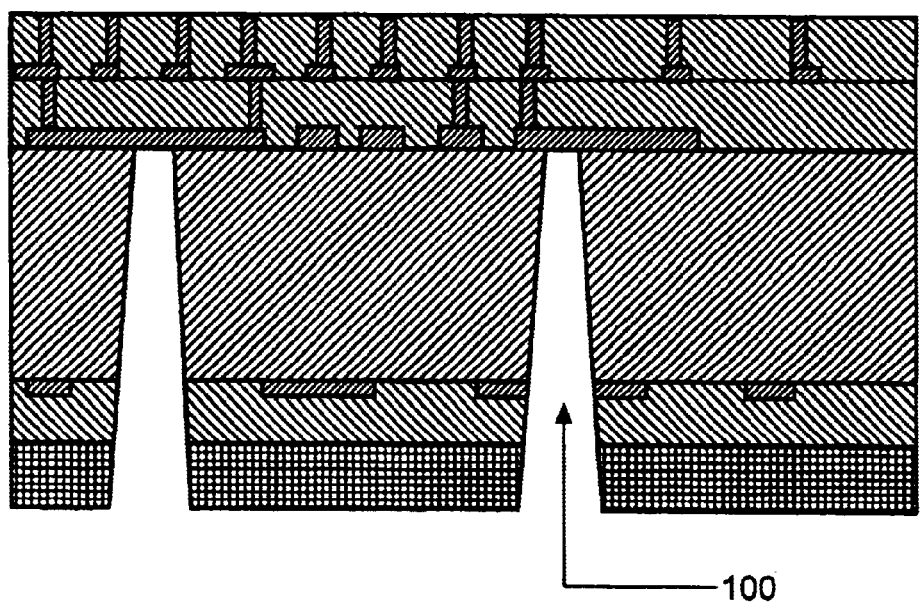

Successively, as shown in FIG. 20(b), sand blasting is applied by using the identical mask used to form the hole (convex portion) of the stress relaxation layer 5 to form a through hole 100 in the insulation substrate 1.

The conditions for forming the through hole 100 have to be selected properly depending on the characteristic of the substrate material, particularly, the modulus of elasticity or breakage toughness of the substrate, and it is desirable to use processing particles having a specific gravity of 2.0 to 10.0 and a bending stress as a bulk material of 0.1 to 2.0 GPa. As the particle size of the processing grain is larger, the processing speed tends to be increased, but, on the other hand, it tends to cause problems, such as micro-cracks or chipping to be described later.

In this embodiment, the grain size (#) of the processing powder is determined while taking into consideration the material of the substrate, the fabrication size of the through hole (thickness, diameter) and the desired processing rate, and it is desirably within a range from #150 to #2000. In this embodiment, one or an appropriate combination of #500, #600, #700, #800, #900, #1000, #1100, #1200 is used. The processing powder is recycled and reused. Since the grains of powder tend to collide against each other and are pulverized during use, it is preferably classified properly such that the grain size is kept in the range described above. Furthermore, since pulverized powder for the through hole portion of the substrate also intrudes, it is removed if necessary.

Accordingly, the sand blast machine used for formation of the through hole in this embodiment preferably has a recycling/reusing mechanism and a classification mechanism. It is practical to use a sand blast machine adapted such that recycling/reuse or classification of the processing powder are automatically carried out parallel with the fabrication of the through hole.

Further, when a hole is formed in the stress relaxation layer by photoetching or laser processing, fabrication residual resin may sometimes remain on the surface of the insulation substrate 1, and the residue is removed together upon sand blasting conducted on the insulation substrate 1. When an aperture is formed by a usual laser processing to a resin, smear of the resin leading to a lowering of the reliability of the wire connection occurs, and desmearing processing such as by chemical processing is necessary. In the manufacturing step according to this embodiment, since sand blasting is applied to the concave portion formed by laser processing, the smear can be removed at the stage of the sand blasting and no chemical desmearing processing is necessary.

When the through hole 100 is formed by sand blasting, it is formed such that the diameter of the through hole 100 is different from one opening end to the other opening end, and, by the provision of such taper, an electric supply film tends to be formed easily on the inner surface of the through hole 100 by the deposition method of sputtering or electroless plating.

When copper wirings are formed previously at portions where through holes 100 are formed to the surface of the insulation substrate 1 where the stress relaxation layer 5 is not formed (primary side), it is possible to prevent scraping of the interlayer insulation layer 110 (thin film wiring layer 2) on the primary side by sand blasting after sand blasting penetrates the insulation substrate 1.

After forming the through hole 100, the mask is removed, for example, by etching. Successively, micro-cracks formed at the periphery of the through hole 100 in the insulation substrate 1 in the course of forming the through hole 100 are removed as required. Micro-cracks formed to the insulation substrate 1 are generally classified into two types, including so-called median cracks and lateral cracks. The median crack is a crack extending in the direction of the depth relative to the side wall surface of the through hole, while the lateral crack extends in the direction along the surface relative to the side wall surface of the through hole.

According to our experiment, it is assumed that the state of occurrence of the lateral cracks gives an effect on the efficiency of the through hole fabrication by sand blasting, and the working efficiency of the sand blasting increases by selecting fabrication conditions so as to form lateral cracks easily. On the other hand, the median cracks extend to the direction of the depth relative to the wall surface of the through hole and, according to our experiment, the strength, particularly the flexural strength of the substrate, tends to be lowered as the number of median cracks increases.

Accordingly, in this embodiment, it is important to select such sand blasting conditions that lateral cracks are formed easily, while less median cracks are formed. According to our experiment, it has been found that the ratio for the occurrence between the lateral cracks and the median cracks depends on (1) the hardness of the processing grains, (2) the shape of the processing grains, (3) the grain size of the processing grains, (4) the cycle of impingement of the processing grains on the work in a unit time, (5) the colliding angle of the processing particle to the work and (6) the pressure of a gas conveying the processing grains. Accordingly, it is preferred to use a blast machine having a nozzle capable of controlling the cycle of collision in a unit time, the colliding angle and the pressure of the transporting gas. By selecting the appropriate blast machine and processing conditions, the processing efficiency and the substrate strength can be made compatible.

However, it is difficult in practice not to generate median cracks at all, and, if the median cracks are not formed at all, if cracks develop starting from the lateral cracks, they may possibly lower the substrate strength to so as to damage the same, so that it is desirable to add a step of removing micro-cracks after forming the through hole.

According to our experiment, when the uppermost surface of the wall surface of the through hole is removed, such as by conditioning the surface by a mechanical fabrication or chemical treatment in a composition flowing region, micro-cracks can be removed. Alternatively, in the case of a glass substrate, micro-cracks can be removed also by heating and self-fusing at least the periphery of the through hole to a softening-melting temperature. The method of heating the periphery of the through hole can include, for example, laser annealing. Alternatively, when the glass substrate is entirely heated to self fuse micro cracks followed by gradual cooling, since distortions accumulated in the glass substrate upon hole fabrication are released, the failure rate caused by cracking of the substrate can be lowered.

Figure 21A:
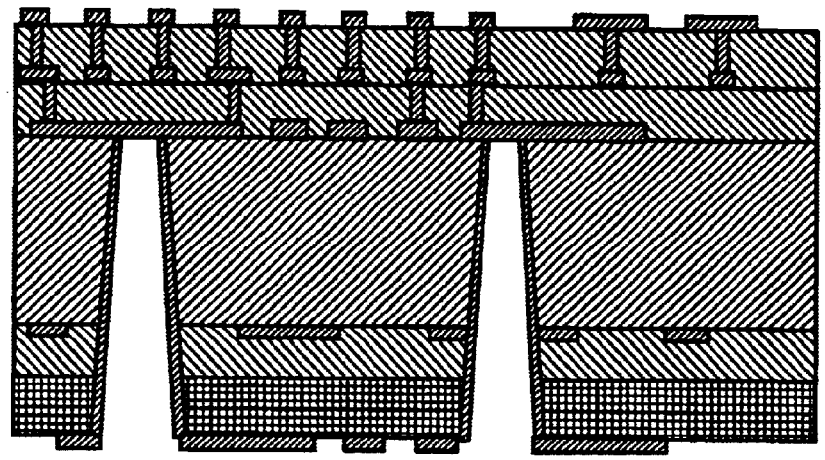
FIGS. 21(a) and 21(b) are cross-sectional views showing steps in the process of manufacture of a semiconductor module according to this invention.

Then, as shown in FIG. 21(a), for establishing electrical connection between the wiring layers on the primary side and the secondary side of the insulation substrate 1, wirings are formed on the inner wall surface of the through hole 100 and the uppermost surface of the multi-layered wiring substrate.

There are several suitable wiring forming methods applicable to the embodiment, and typical examples thereof are described below. In a first method, an electric supply film is formed at first by sputtering, CVD, vapor deposition or the like on the inner wall of the through hole 100.

As the electric supply film, a multi-layered chromium/copper film is preferred and any of film constitution customary to a plating electric supply film may be used such as multi-layered titanium/copper film. Chromium has a function of ensuring adhesion between the substrate and copper, and the thickness is about 75 nm and about 0.5 nm at the greatest. On the other hand, the thickness of copper of the electric supply film is about 0.5 $\mu$m and 1 $\mu$m at the greatest.

After forming the electric supply film and then forming a film of the plating resist on the surface of the insulation substrate 1 and forming a plating mask opposite to the wiring pattern by photolithography, wirings are formed on the electric supply film by electric plating. By way of removal of the resist and removal of the plating species film, an insulation layer (interwire insulation film) is formed between the wirings.

In a second method, a subtractive method is used for the formation of the wirings. Up to the step of forming a multi-layered film comprising chromium/copper or the like by sputtering as the wirings is identical with the first method, and, subsequently, after application of plating on the entire surface, an etching resist is formed on the surface and the rear face of the insulation substrate and an etching mask pattern is formed by photolithography. After forming wirings by etching, the resist is removed, thereby to form an interwire insulation film.

In a third method, a conductive material is filled inside the through hole. The conductive material is filled, for example, by using paste printing. Prior to the filling of the conductive material, sputtering may be applied to deposit a film on the inner wall of the through hole like the two methods described above. Formation of the sputtered film on the surface of the inner wall can provide effects such as (1) improvement in the filling due to the improved smoothness on the surface of the inner wall and (2) improvement of adhesion between the filling material and the insulation substrate.

In this case, the deposited sputtered film may be a multi-layered chromium/copper film identical with that used in the first and second method or may be a single layered film. In the case of using solder as the conductive material, it is preferable a laminate with a film of copper, nickel, gold or the like for ensuring wettability between the film of chromium or titanium and solder to ensure the adhesion with the insulation substrate. After filling the conductive material inside the through hole, wirings are formed on the surface of the substrate by the semi-additive method or a subtractive method. Depending on the wiring pattern, filling in the through hole and the formation of the wiring pattern can be attained together by paste printing.

By using the first to third methods alone or in appropriate combination, conductive wirings of the through hole for connecting the surface and the rear face of the substrate and the wirings on the surface of the substrate (secondary side) are formed. The wirings on the surface of the substrate are laminated by a required number of layers and they are preferably copper wirings in view of the electric resistance. Further, depending on the requirement, different species of metals may sometimes be formed on the surface of the copper in view of adhesion reliability or connection reliability.

In a case where the insulation substrate 1 is a glass substrate, since the glass is an insulating material, wirings may be formed so as to be in direct contact with the inner wall of the through hole with no problems, but an insulation film may be formed so as to cover the surface of the inner wall surface of the through hole in view of the adhesion, the connection reliability, the migration resistance and the moisture-proof characteristic. On the other hand, in a case where the insulation substrate 1 comprises a silicon substrate, since silicon has conductivity, it is necessary to provide an insulation layer so as to cover the surface of the inner wall surface of the through hole prior to formation of the wirings for connecting the surface and the rear face of the wiring substrate 1.

Figure 21B:
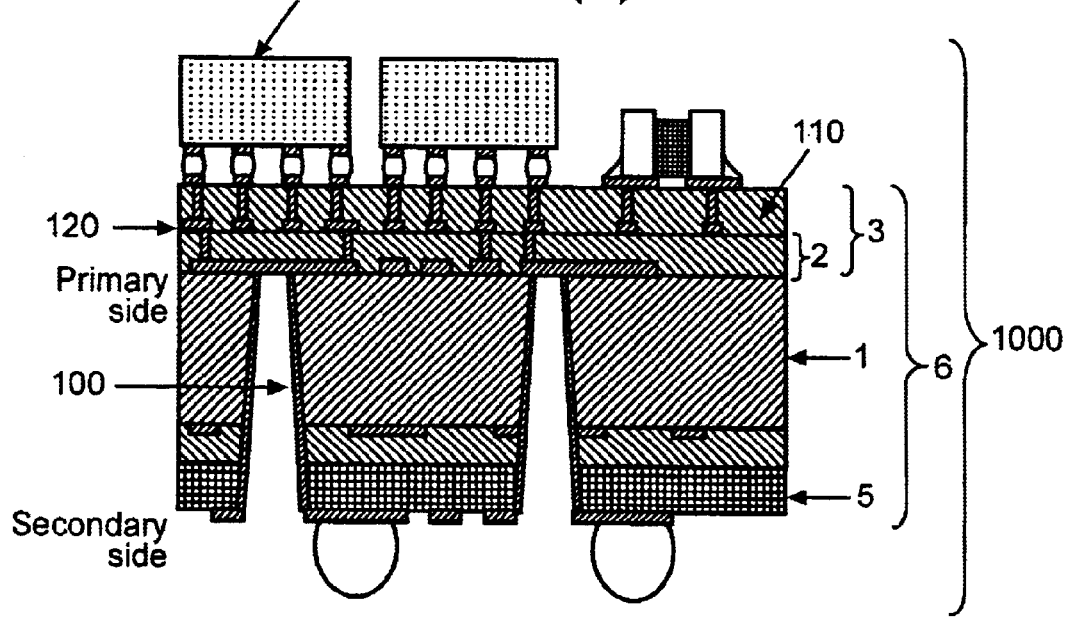

Then, as shown in FIG. 21(b), semiconductor devices 9 and a capacitor are mounted on the multi-layered wiring substrate 6 by using external connection terminals such as solder bumps or an anisotropic conductive sheet (ACF) formed to the semiconductor device to form a semiconductor module. External connection terminals, for example, solder bumps 7 for mounting the semiconductor module 1000 to the mounting substrate 10 are formed on the secondary side of the multi-layered wiring substrate 6 (secondary connection bump).

The semiconductor device 9 may be mounted by using the solder bumps formed on the semiconductor device or by using the bumps formed to the wiring substrate. For example, solder bumps are formed in accordance with the pitch of the external terminal of the semiconductor device 9 on the primary side of the wiring substrate (primary bumps). Generally, the bump pitch often ranges from about 50 to 500 μm and the bump size is adjusted to be about 15 to 80% and, preferably, about 30 to 65% of the bump pitch.

Then, the semiconductor device 9 is mounted to the multi-layered wiring substrate 6 by using the thus formed primary bumps. The pitch of the primary bump is about 50 to 500 μm. While the difference of the thermal expansion coefficient between the wiring substrate 6 and the semiconductor device 9 is small, and, if necessary, an underfill agent may be inserted between the wiring substrate 6 and the semiconductor device 9, or a potting material may be coated to an upper portion of the semiconductor device 9. Alternatively, a resin mold may be applied to predetermined semiconductor devices. In a fine bump with a bump size of 200 μm or less, the mechanical strength is sometimes lowered by the decrease of the bump volume. In such a case, the underfill agent or the potting material is used alone or in combination, by which problems such as reduction of the reliability can be prevented.

Then, bumps for mounting the semiconductor module to the mounting substrate 10 (secondary bump) are formed. Thus, the wirings for the semiconductor device 9 (semiconductor chip) and the primary bumps 7 are electrically connected and a fine pitch is attained by the multi-layered wiring substrate 6.

In this embodiment, the bumps 7 for mounting the semiconductor module to the mounting substrate 10 (secondary bumps) are formed after forming the bumps on the primary side. However, the primary bumps may be formed, if necessary, after forming the secondary bump.

Further, while two semiconductor devices are described in FIG. 1, the number of the semiconductor devices 9 is optional, and it will be apparent that a so-called multi-chip module, can be provided in which plural semiconductor devices 9 (semiconductor chips) are mounted on the multi-layered wiring substrate 6.

By the steps described above, the multi-chip module can be formed in the form of a wafer. The multi-chip module is tested for its characteristics and the compatibility between each of the chips, and chips or the like are replaced on the wafer as required. Subsequently, the multi-layered wiring substrate is subjected to dicing to separate multi-chip modules individually.

Each of the multi-chip modules is mounted to the mounting substrate and an electronic equipment, for example, an information portable terminal being manufactured.

In the manufacturing method according to this embodiment, since the through hole 100 is apertured by sand blasting, it is not necessary to use expensive light sensitive glass as the substrate material, and the multi-chip module can be manufactured by using a glass substrate or a silicon substrate having a reduced cost.

Further, when a copper pad is previously formed on the secondary side of the insulation substrate 1 at a position of the through hole 100 formed by sand blasting, the occurrence of micro-cracks in the insulation substrate 1 can be suppressed to improve the strength and the reliability of the multi-chip module.

Further, when copper wirings are previously formed at the position for the through hole 100 formed by sand blasting on the primary side of the insulation substrate 1, corrosion or erosion in the interlayer insulation layer 110 can be prevented.

Figure 23:
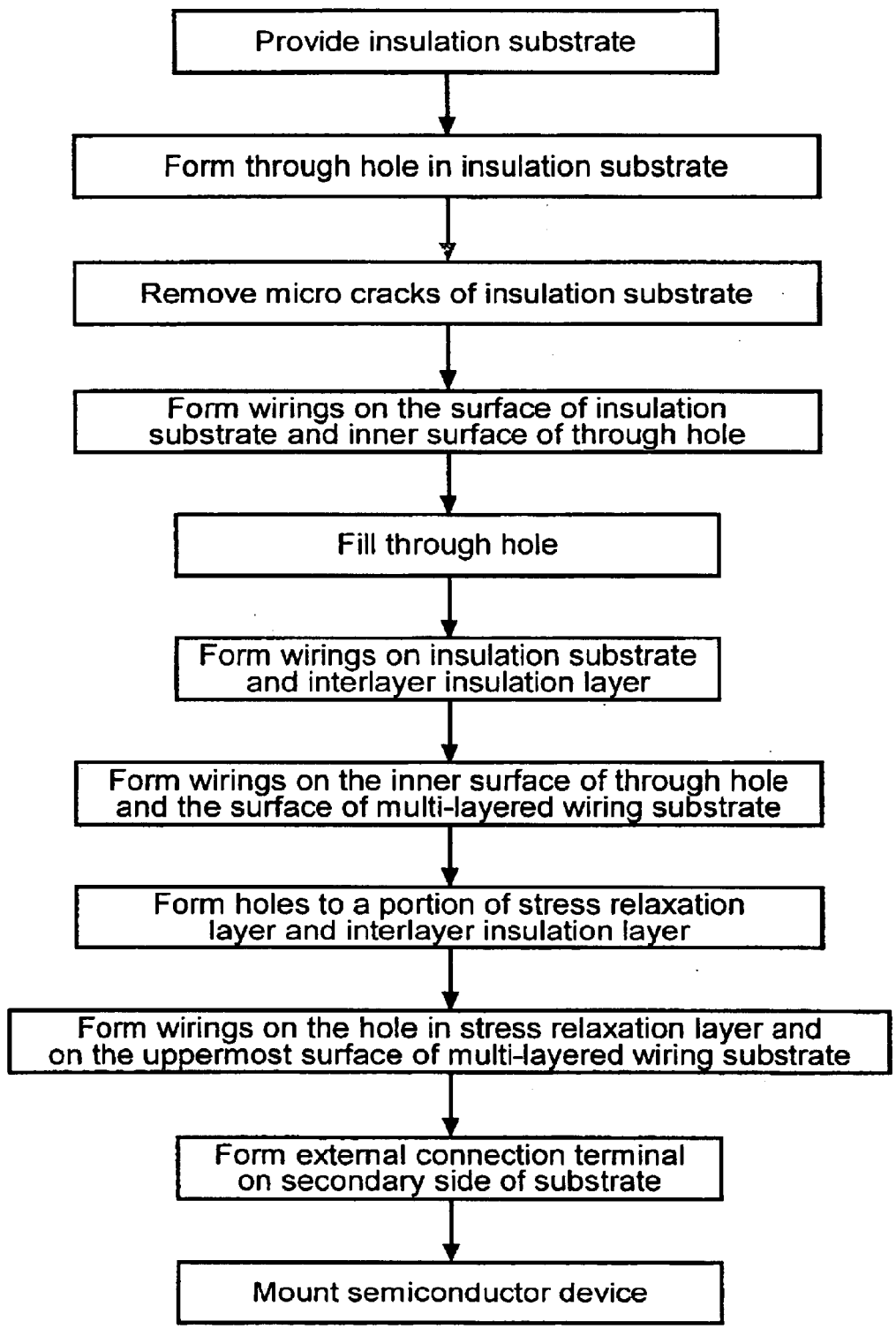
FIG. 23 is a flow chart showing an example of a manufacturing process for a semiconductor module according to this invention.

Now, another method of manufacturing a multi-chip module will be explained. FIG. 23 us a flow chart of a manufacturing method according to this embodiment. This is different from the first embodiment mainly in the order of steps for forming through holes 100 in the insulation substrate 1.

At first, in the same manner as in Embodiment 1, a glass substrate or a silicon substrate is provided as an insulation substrate 1 for use in the wiring substrate, and, if necessary, surface conditioning or cleaning or surface insulation treatment is previously conducted for the surface and the end face.

Figure 24A:
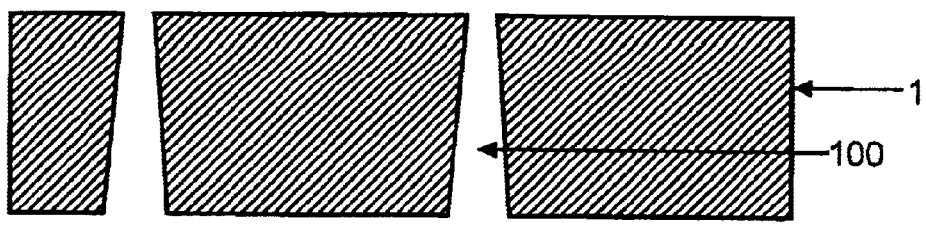
FIGS. 24(a) to 24(d) are cross-sectional views showing steps in another example of a manufacturing process for a semiconductor module according to this invention.

Then, as shown in FIG. 24(a), through holes 100 are formed only in the insulation substrate 1 by sand blasting in the same manner as in die first embodiment. Micro-cracks are formed by the sand blasting in the insulation substrate. Successively, the micro-cracks formed in the insulation substrate 1 are removed by the same method as in the first embodiment.

Figure 24B:
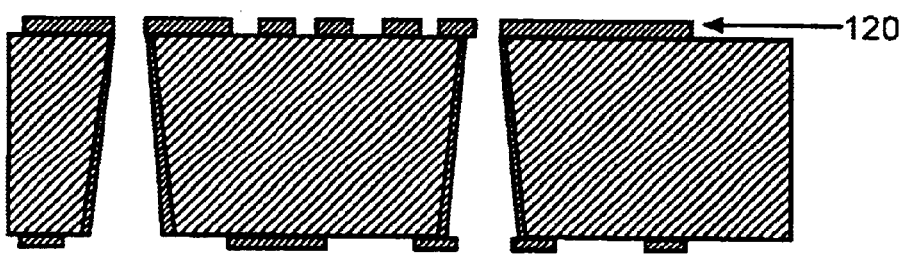

Then, as shown in FIG. 24(b), wirings 120 are formed to and in the through holes 100 in the insulation substrate 1 and on the insulation substrate 1. The wirings can be formed by using the semi-additive method or the subtracting method as in Embodiment 1.

This is different from Embodiment 1 in that the electric supply film is formed on three surfaces, namely, the inner surface of the through hole 100 and the surface and the rear face of the insulation substrate 1 (primary surface, secondary surface). The electric supply film may be formed simultaneously from both surfaces or may be formed on every side, such as at first for the primary surface, and then for the secondary surface. In view of simultaneous formation on the three surfaces, an electroless plating method is effective. In a case of forming the electric supply film by sputtering, the electric supply film can be formed on the inner wall of the through hole simultaneously with the deposition of the electric supply film on the surface and the rear face of the substrate, particularly, deposition of the film on the secondary surface. The electric supply film can include, for example, a multi-layered chromium/copper film like in Embodiment 1. The method of forming wirings after forming the æelectric supply film includes the following two methods.

The first method is a semi-additive process. A film of plating resist is deposited on the surface and the rear face of the insulation substrate 1 (primary surface and secondary surface), a resist pattern as a pattern opposite to desired plating wirings are formed by photolithography and then wirings are formed by plating. By opening the resist above the through hole, the inner wall of the through hole 100 and the surface and the rear face of the substrate can be plated together. Wirings for the inner wall of the through hole and wirings for the surface and the rear face of the substrate can be pattern-separated at one time by a pattern separation step by an ordinary method. The wiring material can include, for example, Cu, Al, Ag, Au and Ni.

The second method is a subtracting process. The inner wall of the through hole 100 and the surface and the rear face of the substrate are simultaneously plated by ordinary plating. A film of an etching resist is deposited on the plated film, a resist pattern is deposited as a pattern opposite to a desired wiring pattern is formed by photolithography and then the wirings are separated by etching. The wiring material includes Cu, Al, Ag, Au, Ni and the like that in the first method.

As described above, in this embodiment, since formation of the wirings for the inner wall of the through hole 100 and the surface and the rear face of the substrate (primary surface and the secondary surface) can be conducted simultaneously, the number of steps for exposure, development and plating can be decreased greatly.

Figure 24C:
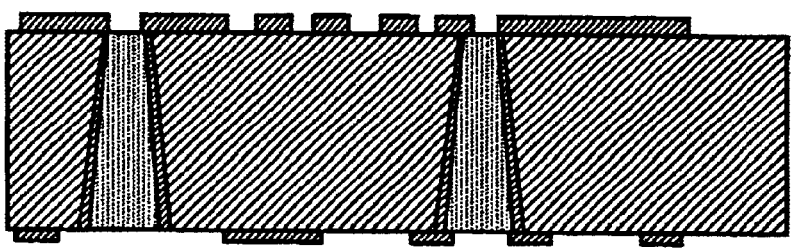

Then, as shown in FIG. 24(c), a filling material is filled in the through holes 100. The filling material need not necessarily be a conductive material, but may be an insulation material. The material preferably has such a high fillage that it can be filled by a simple and convenient filling method, such as paste printing. In a case where it can not be filled in the through hole 100 by one printing step, it is necessary to apply printing several times.

Figure 26:
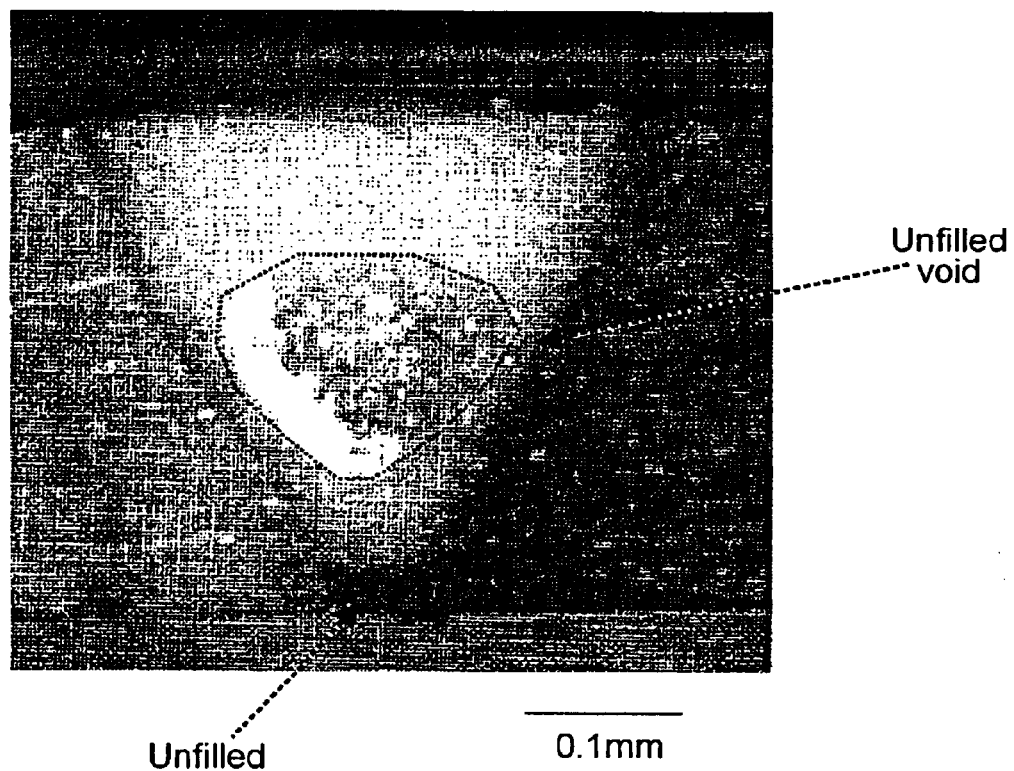
FIG. 26 is a microphotograph of a not-filled portion formed in a through hole.

FIG. 26 shows a state in which a not yet filled portion is formed at the central part of the through hole 100 when the through hole 100 is actually filled by conducting paste printing five times (hereinafter referred to as an unfilled void 200). In the insulation substrate incorporating the unfilled void 200, since air in the void expands/shrinks in response to every change of temperature during the manufacturing process, for example, a temperature change in the insulation film deposition step or soldering step, wirings on the inner wall of the through hole tend to be disconnected, or distortion is accumulated inside the insulation substrate 1 to possibly lower the strength of the insulation substrate. Further, if the unfilled void 200 is formed in the first printing step, since the pressure to the paste is partially released in the mode of compression of the void during second and succeeding printing steps, the printing pressure is insufficient, and, as a result, complete filling can not be attained. Since the pressure loss is large in the vicinity of the end face on the primary side of the insulation substrate 1 where the diameter of the hole is smaller, an unfilled portion 201 may sometimes be formed near the end face on the primary side in a case were the printing pressure is insufficient.

Further, above the through hole incorporating the unfilled void 200, it is difficult to precisely deposit an interlayer insulation film or an inter-wire insulation film made of polyimide, polybenzocyclobutene or the like. This is because the void expands upon heating of the insulation film in the hardening process, thereby to deform the insulation layer present on the surface of the substrate in the course of hardening under the effect of the expansion.

Over the unfilled portion 201 formed near the end face on the primary side of the insulation substrate 1, it is difficult to form a flat interlayer insulation layer in the succeeding step. One of the available countermeasures is to not form the unfilled void in the through hole, for which it is effective to apply paste printing while sucking from the rear face of the through hole. Further, it is effective to adopt a treatment, for example, of conducting paste printing using an insulation material not containing volatile ingredients or with less content of the volatile ingredients, or reducing the pressure for the entire substrate after paste printing to remove voids and then exerting a hydraulic pressure. For example, a non-solvent varnish is effective as the insulation material.

Another countermeasure is to coat a conductive material a concave portion of the unfilled portion 201 formed near the end face on the primary side prior to formation of the wirings on the insulation substrate 1. This makes the upper surface of the insulation substrate 1 flat even if the unfilled portion 201 is present. This can be attained by using a silver paste or the like as the conductive material and printing the same to the concave portion of the unfilled portion 201.

Figure 24D:
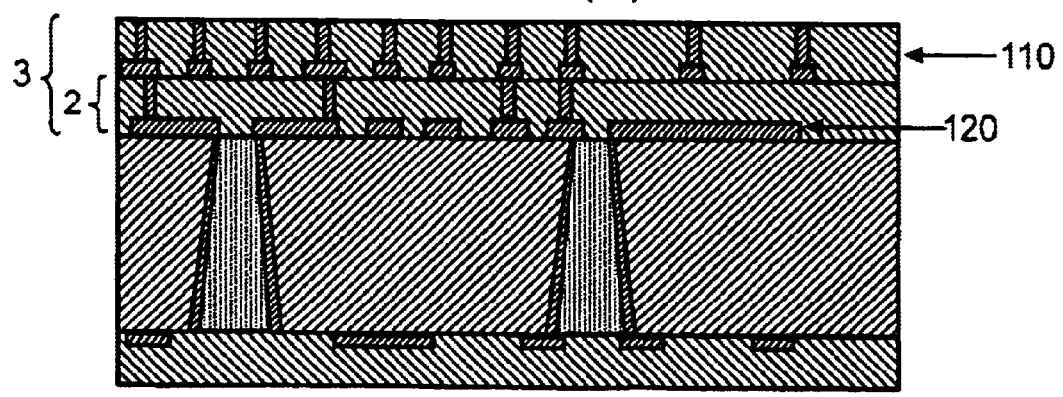

As shown in FIG. 24(d), a multi-layered wiring layer 3, comprising thin film wiring layers 2 having wirings 120 and an interlayer insulation layer 110, is formed on the insulation substrate 1 in which the through holes 100 are filled. The wiring forming step itself is substantially identical with that in the first embodiment.

Figure 25A:
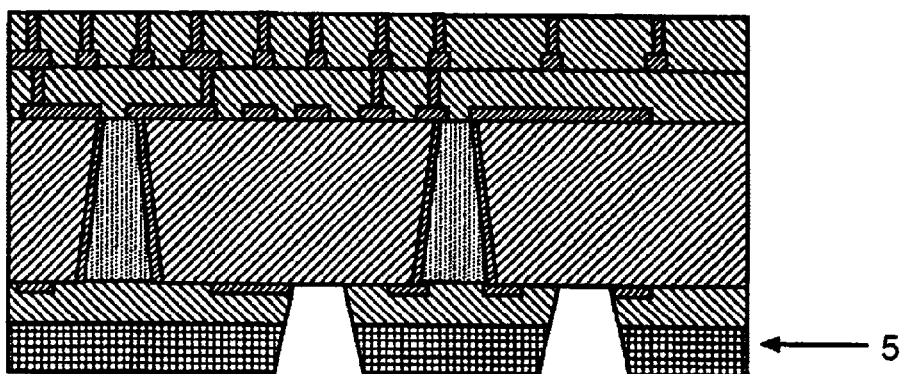
FIGS. 25(a) to 25(c) are cross-sectional views showing further steps in the manufacturing process for a semiconductor module following the step of FIG. 24(d)

Then, as shown in FIG. 25(a), a stress relaxation layer 5 is formed optionally, and, further, holes (via holes) are formed in the stress relaxation layer 5 by photoetching or laser processing. The step for forming the stress relaxation layer 5 itself is substantially identical with that in the first embodiment.

Figure 25B:
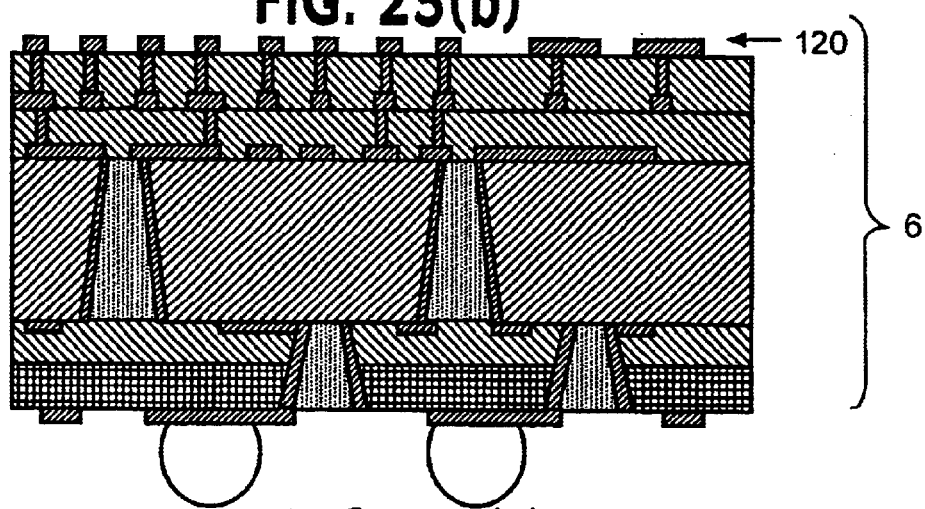

Then, as shown in FIG. 25(b), wirings are formed on the multi-wiring layer 3 and on the holes and the surface of the stress relaxation layer 5 to complete a multi-layered wiring substrate 6.

Figure 25C:
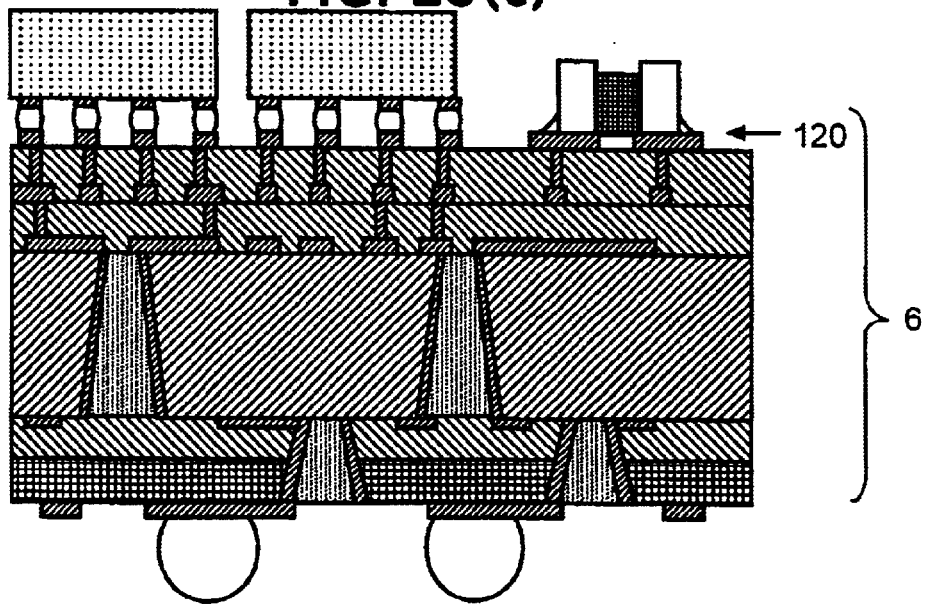

As shown in FIG. 25(c), the semiconductor devices are mounted on the multi-layered wiring substrate 6. The steps from the formation of the bumps, after completing the multi-layered wiring substrate 6, to the formation of the module is substantially identical with that in the first embodiment.

According to this embodiment, since the insulation material is filled in the insulation substrate 1, the strength of the insulation substrate 1 and the multi-layered wiring substrate 6 are improved compared with the case of not filling the through holes 100, and the reliability of the multi-chip module is also improved.

Further, since formation of the wirings to the inner wall of the through holes 100 and the surface and the rear face (primary surface and secondary surface) of the substrate can be conducted simultaneously, the number of steps for exposure, development and plating can be decreased greatly to improve the production efficiency of the multi-chip module.

Another manufacturing method for production of the multi-chip module will be explained with reference to FIGS. 27(a) to 27(c) and FIGS. 28(a) to 28(c).

At first, in the same manner as in the second embodiment, a glass substrate or a silicon substrate is provided as the insulation substrate 1 for use in the wiring substrate, and, optionally, surface conditioning, cleaning, or surface insulation treatment is applied to the surface or the end face.

Figure 27A:
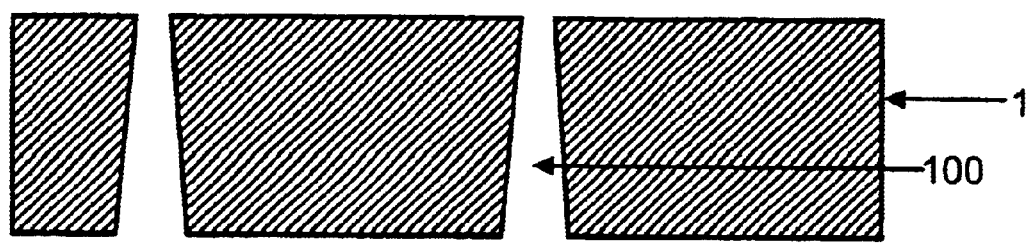
FIGS. 27(a) to 27(c) are cross-sectional views showing steps in still another example of a manufacturing process for a semiconductor module according to this invention.

As shown in FIG. 27(a), through holes 100 are then formed in the insulation substrate 1 by sand blasting. Successively, micro-cracks formed on the insulation substrate 1 are removed.

Figure 27B:
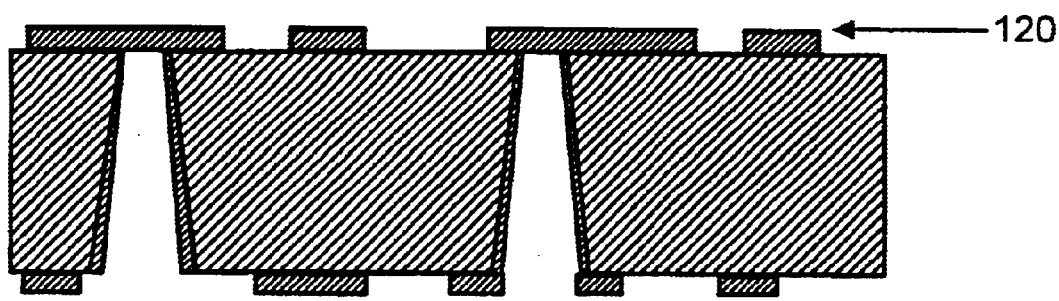

As shown in FIG. 27(b), wirings are then formed in the through holes 100 in the insulation substrate 1 and on the insulation substrate 1. The wirings can be formed by using the semi-additive method or the subtract method like that in the Embodiment 1 and Embodiment 2, and the electric supply films are formed on three surfaces, namely, the inner surface of the through holes 100 and the surface and rear face (primary surface, secondary surface) of the insulation substrate 1 in the manner also identical with Embodiment 2.

Embodiment 2 and this embodiment are different in the order in which the insulation material is filled into the through holes 100 of the insulation substrate 1 and in forming the interlayer insulation layer 110 (thin film wiring layer 2) on the insulation substrate 1. In Embodiment 2, the primary side of the through holes 100 is opened as it is upon forming the wirings to the surface of the substrate, and the inside of the through holes is filled in this state. On the other hand, in this embodiment, the opening ends on the primary side of the insulation substrate 1 are closed with the wirings prior to the formation of the interlayer insulation layer 110 (thin film wiring layer 2). In a case where the diameter of the through hole is small, if the film is thickened, the narrowed opening end of the through hole (primary opening end) can be closed with plating film. After closing the open ends of the through holes, the multi-wiring layer 3 is formed.

Figure 27C:
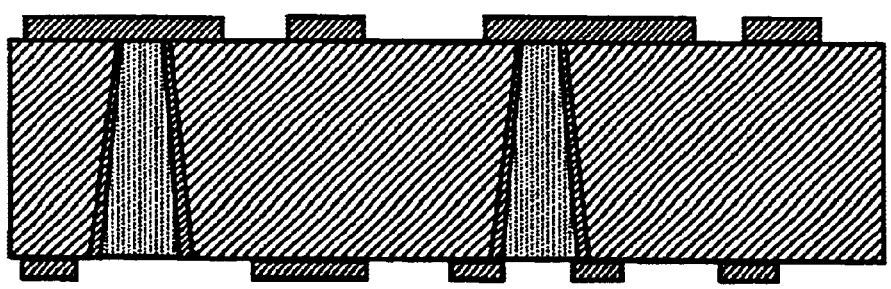

As shown in FIG. 27(c), the through holes 100 closed at the primary open end are filled. Like Embodiment 1 or Embodiment 2, the filling may be conducted by paste printing an insulation material or by filling a conductive material.

Figure 28A:
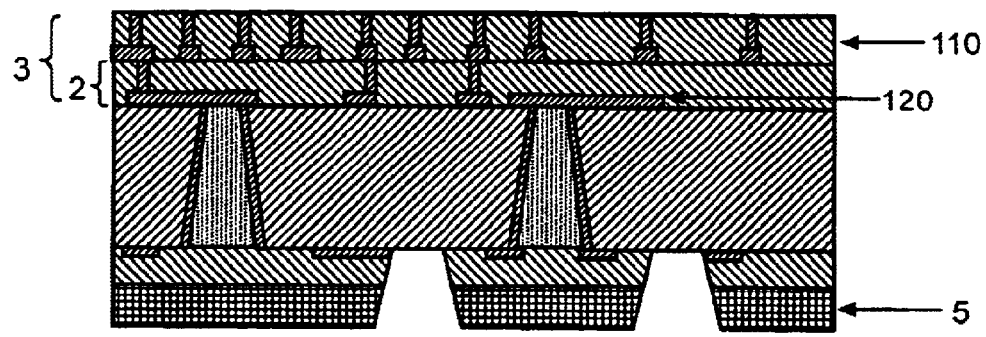
FIGS. 28(a) to 28(c) are cross-sectional views showing further steps in the manufacturing process for a semiconductor module following the step of FIG. 27(c)
Figure 28B:
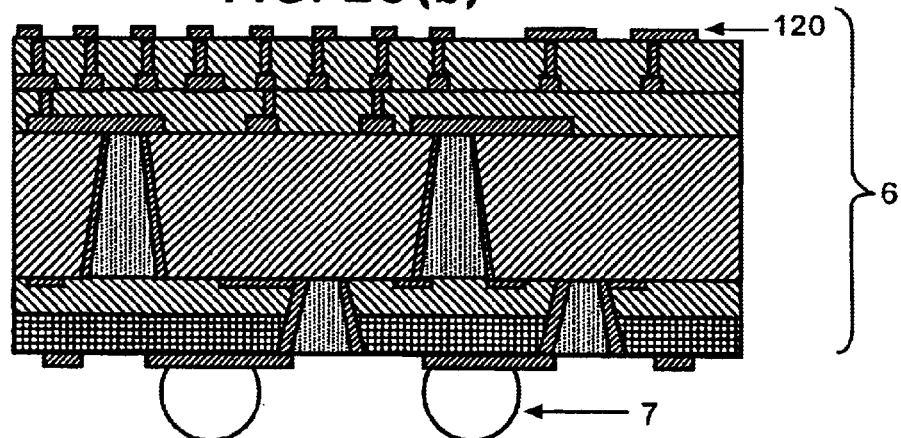

Then, as shown in FIG. 28(a), a stress relaxation layer 5 is optionally formed like that in Embodiment 1 or Embodiment 2, and, further, holes are formed in the stress relaxation layer 5 by photoetching or laser processing. Finally, wirings are formed on the multi-wiring layer 3 and in the holes and on the surface of the stress relaxation layer 5, as shown in FIG. 28(b), to complete a multi-layered wiring substrate 6.

Figure 28C:
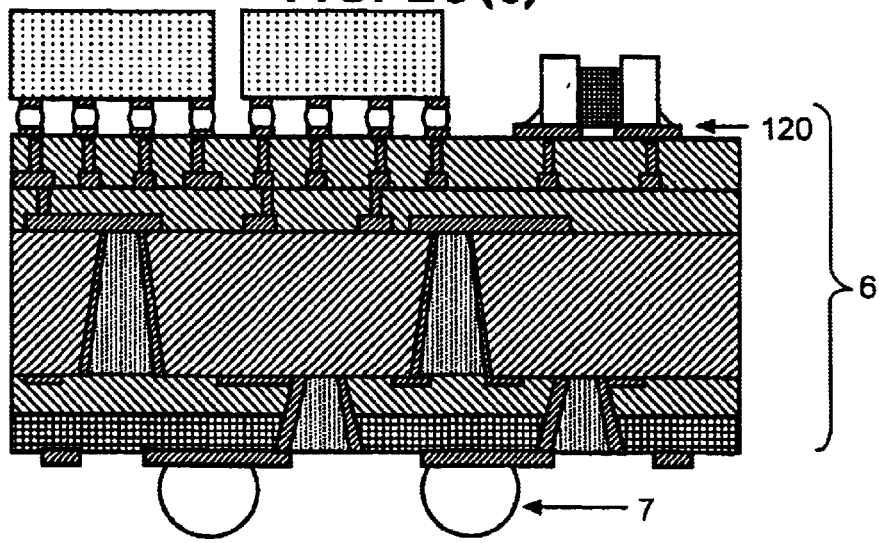

As shown in FIG. 28(c), the semiconductor devices are mounted on the multi-layered wiring substrate 6. The process from the formation of the bumps, after completing the multi-layered wiring substrate 6, to the formation of the module is also substantially identical with that in the first embodiment.

In this embodiment, since the openings of the through holes 100 are closed by the wirings on the secondary side of the insulation substrate 1, an insulation material can be filled in the through holes 100 of the insulation substrate 1. As a result, formation of an unfilled portion 201, that is likely to occur near the end face on the primary side of the insulation substrate 1, can be suppressed effectively. This can ensure the flatness of the interlayer insulation layer formed in the next step, and the wirings can be formed more easily at a high density. Accordingly, a multi-chip module having a further reduced thickness can be manufactured.

Now, the physical property values of the insulation layer 5 (stress relaxation layer 5) formed on the multi-chip module described with reference to the embodiment described above will be explained more specifically.

Since the thickness of the stress relaxation layer 5 depends also on the size of the semiconductor module, the modulus of elasticity of the stress relaxation layer 5, and the thickness and the diagonal length of the insulation substrate 1, it can not be determined generally. However, when a stress simulation experiment was conducted using a bimetal model comprising an insulation substrate 1 and a stress relaxation layer 5 formed on the surface thereof with the thickness of the insulation substrate 1 being set to 0.3 to 0.5 mm, it has been found that an allowable range for the film thickness of the stress relaxation layer 5 is 10 to 500 $\mu$m and, more preferably, 30 to 250 $\mu$m. This corresponds to a thickness of about 1/10 to 1/2 for the thickness of the insulation substrate 1.

When the film thickness is less than 30 pm, no intended stress relaxation can be obtained, and, on the other hand, when the thickness exceeds 250 $\mu$m, the internal stress of the stress relaxation layer 5 itself causes the insulation substrate 1 to warp to thereby possibly damage the substrate or disconnect the wirings.

The stress relaxation layer 5 is formed of a resin material having a modulus of elasticity drastically smaller than that of the insulation substrate 1, for example, a modulus of elasticity of from 0.1 GPa to 10 GPa at room temperature. The stress relaxation layer 5 having a modulus of elasticity within this range can provide a reliable multi-layered wiring substrate 6. That is, the stress relaxation layer 5 having a modulus of elasticity below 0.1 GPa tends to cause a problem in that it is difficult to support the weight of the insulation substrate 1 per se and the characteristic is not stabilized when used as a semiconductor module 1000. On the other hand, the use of a stress relaxation layer 5 having a modulus of elasticity exceeding 10 GPa may possibly cause warping in the insulation substrate 1 due to the internal stress of the stress relaxation layer 55 itself, to possibly break the insulation substrate 1.

The material for forming the stress relaxation layer 5 used herein is a pasty polyimide, the invention but the invention is not restricted only thereto. When the pasty polyimide is used, it can be hardened by heating after coating by printing. Further, the pasty polyimide comprises a polyimide precursor, a solvent and a number of fine polyimide particles dispersed therein. As fine particles, those having a grain size distribution such that the average grain size is 1 to 2 $\mu$m and the maximum grain size is about 10 $\mu$m were used. Since the polyimide precursor in this embodiment forms identical material with the fine polyimide particles when cured, a uniform stress relaxation layer 5 comprising a single kind of material is formed when the pasty polyimide is hardened. While polyimide is used as the material for forming the stress relaxation layer 5 in this embodiment, an amideimide resin, ester imide resin, ether imide resin, silicone resin, acrylic resin, polyester resin or those resins modified therefrom can be used in addition to the polyimide in this embodiment. In a case of using a resin other than the polyimide, it is desirable to apply a treatment for providing the surface of the fine polyimide particles with conductivity or to apply modification to the resin composition in order to improve the affinity with the fine polyimide particles.

Among the resins set forth above, those resins having imide bondings, for example, polyimide, amideimide, ester imide and ether imide are excellent in thermal mechanical characteristics, for example, strength at high temperature due to the strong skeleton by imide bonding, and, as a result, the selectable range for the method of forming the plating electric supply system for wirings can be extended. For instance, a method of forming a plating electric supply film that includes high temperature treatment, such as sputtering, can be selected. A resin containing a portion condensed by bondings other than the imide bonding, such as silicone resin, acryl resin, polyester resin, amideimide, ester imide and ether imide, is sometimes advantageous in view of the fabricability or the cost of the resin, although the thermal mechanical characteristics are sometimes deteriorated. For example, the polyester imide resin is easy to handle since the curing temperature is generally lower than that of the polyimide.

As the material for forming the stress relaxation layer 5, epoxy, phenol, polyimide, silicone or like other resin may be used alone or as a blend of two or more of them, to which a coupling agent for improving the adhesion at various boundaries or a colorant may be blended for use.

In this embodiment, the resins described above are selectively used properly while the cost and thermal mechanical characteristics are taken into consideration collectively.

Since the viscoelastic property of the material can be controlled by dispersing fine polyimide particles in the pasty polyimide, a paste of excellent printability can be used. Since the thixotropic property of the paste can be controlled by adjusting the blending of the fine particles, the printing property can be improved in combination with the viscosity control. The thixotropic property of the paste suitable to use in this embodiment preferably has a so-called thixotripic index within a range from 1.0 to 10.0, the index being determined based on the ratio of the viscosity at a number of rotations of 1 rpm and the viscosity at a number of rotations of 10 rpm as measured by using a rotary viscometer. In the case of a paste in which temperature dependence exists for the thixotropy index, a satisfactory result can be obtained by printing in such a high temperature region that the thixotropic index ranges from 1.0 to 10.0.

When the required thickness of the stress relaxation layer 5 can not be formed by printing and heat hardening in one step, a predetermined film thickness can be obtained by repeating printing and hardening of the material several times. For example, in a case where a paste at a solid concentration of 30 to 40% was used and a metal mask of 65 μm was used, a film thickness of about 50 μm can be obtained after hardening by printing twice.

Further, the hardening temperature of the material for use in the stress relaxation layer 5 is preferably from 100° C. to 250° C. If the hardening temperature is lower than the range, control in the step for the manufacture of semiconductor modules is difficult, and, on the other hand, if the hardening temperature is higher than the range, the stress in the insulation substrate 1 may possibly increase due to thermal shrinkage upon hardening and cooling.

Figure 29:
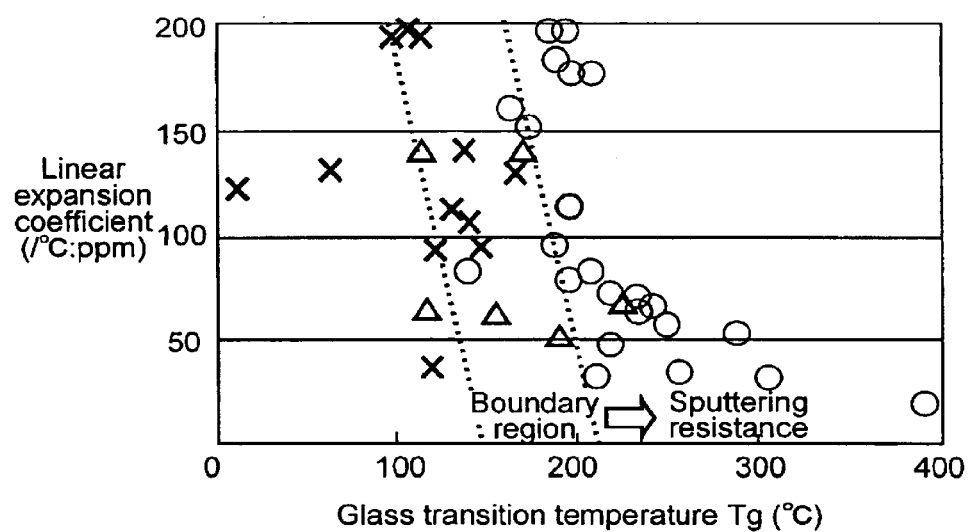
FIG. 29 is a graph showing the result of an experiment concerning the relation between glass transition temperature (Tg) and linear expansion coefficient.

Since the stress relaxation layer 5 after hardening is exposed to various steps, such as sputtering, plating or etching, it is also required to have such properties as heat resistance, chemical resistance and solvent resistance. Specifically, referring to the heat resistance, the glass transition temperature (Tg) is preferably higher than 140° C. and 400° C. or lower, and, more preferably, (Tg) is 180° C. or higher and, most preferably, (Tg) is 200° C. or higher. FIG. 29 shows the results of an experiment concerning the relation between the glass transition temperature (Tg) and a linear expansion coefficient. It can be seen from the results that no cracks are formed so long as the glass transition temperature (Tg) is 200° C. or higher. With a view toward suppressing the deformation in various temperature processing operations in the step, the smaller linear expansion coefficient (αl) in the region lower than Tg is preferred. Specifically, it is better as the value is closer to 3 ppm/° C. Generally, a material of low elasticity often has a larger linear expansion coefficient, and, in this embodiment, the range of the linear expansion coefficient for the suitable stress relaxation layer 5 is preferably within a range from 3 ppm/° C. to 300 ppm/° C. More preferably, it ranges from 3 ppm/° C. to 200 ppm/° C., and a most preferable thermal expansion coefficient is 3 ppm/° C. to 150 ppm/° C. Further, in a case where the linear expansion coefficient is larger, the modulus of elasticity coefficient described above is desirably smaller. More specifically, it is preferred that the value for the product of the modulus of elasticity (GPa) and the thermal expansion coefficient (ppm/° C.) fall within a specified range. While the desirable range for the value fluctuates also depending on the size and the thickness of the substrate and the mode of mounting the same, it is generally preferred that the value is approximately within a range from 50 to 1000.

On the other hand, the thermal decomposition temperature (Td) æis preferably about 300° C. or higher, and, more preferably, about 350° C. or higher. If the values for Tg and Td are below the values described above, there may be a concern that the resin will be deformed, denatured or decomposed in a thermal step of the process, for example, in the sputtering and sputter etching steps. In view of the chemical resistance, it is preferred that the resin does not cause denaturation, such as discoloration or deformation, when dipped in a 30% sulfuric acid solution or an aqueous 10% solution of sodium hydroxide for 24 hours or more. Referring to the solvent resistance, it is preferred that the solubility parameter (SP value) is from 5 to 30 $(cal/cm^3)^{1/2}$. When the resin for use in the stress relaxation layer 5 is a material formed by modifying several ingredients in the basic resin, it is preferred that largest portion of the composition fall within the range of the solubility parameter described above. More specifically, it is preferred that ingredients with a solubility parameter (SP value) of less than 5 or exceeding 30 are not contained more than 50% by weight.

If the chemical resistance or the solvent resistance is insufficient, it may possibly restrict the adaptable manufacturing process and is not preferred with a view toward reduction of the manufacturing cost. Actually, the material for use in the stress relaxation layer 5 is preferably determined while collectively considering the material cost and the degree of freedom of the process capable of satisfying the properties.

This invention has been described specifically based on preferred embodiments, but the invention is not restricted to the embodiments described above, but may be modified variously within such a range as not departing from the gist of the invention.

In the multi-chip module according to this invention, the connection reliability between the semiconductor chips and the wiring substrate for mounting the semiconductor chips, as well as the connection reliability between the multi-chip module and the mounting substrate for mounting the multi-chip module, can be improved.

What is claimed is:

1. A multi-chip module including semiconductor devices and a wiring substrate for mounting the semiconductor devices, wherein the wiring substrate comprises a first substrate having through holes, a first wiring layer formed on one surface of the first substrate and having first wirings and a first insulation layer, a second wiring layer formed on the other surface of the first substrate and having second wirings and a second insulation layer, in which the heat expansion coefficient is different between the first wiring layer and the second wiring layer, wherein the heat expansion coefficient of the first wiring layer is close to the heat expansion coefficient of the semiconductor device, and the heat expansion coefficient of the second wiring layer is close to the heat expansion coefficient of a mounting substrate for mounting the wiring substrate.

2. A multi-chip module having semiconductor devices and a wiring substrate for mounting the semiconductor devices, wherein the wiring substrate comprises:

a first substrate having through holes;

a first wiring layer having first wirings and a first insulation layer formed to the surface of the first substrate on the side where the semiconductor devices are mounted; and a second wiring layer having second wirings and a second insulation layer formed to the surface of the first substrate on the side where the wiring substrate is mounted;

wherein the heat expansion coefficient of the first wiring layer is close to the heat expansion coefficient of the semiconductor device, and the heat expansion coefficient of the second wiring layer is close to the heat expansion coefficient of a mounting substrate for mounting the wiring substrate.

3. A multi-chip module according to claim 2, wherein:

said first substrate includes through holes with a heat expansion coefficient being from 3 ppm/° C. to 5 ppm/° C.;

a third insulation layer is formed to the surface of the second wiring layer on the side opposite to the first substrate; and wherein the modulus of elasticity of the third insulation layer is from 0.1 GPa to 10 GPa.

4. A multi-chip module as defined in claim 3, wherein the first substrate is a glass substrate.

5. A multi-chip module as defined in claim 3, wherein the third insulation layer is formed on a region with no opening of a hole formed in the first substrate.

6. A multi-chip module as defined in claim 3, wherein the heat expansion coefficient of the third insulation layer is from 3 ppm/° C. to 300 ppm/° C.

7. A multi-chip module as defined in claim 3, wherein the thickness of the third insulation layer is from 30 μm to 250 μm.

8. A multi-chip module as defined in claim 3, wherein the third insulation layer comprises a resin having imide bondings.

9. A multi-chip module as defined in claim 3, wherein the third insulation layer is formed by printing using a mask.

10. A multi-chip module as defined in claim 3, wherein the through holes in the first substrate are formed by sand blasting.

11. A multi-chip module as defined in claim 10, wherein the semiconductor device is mounted on the surface where the opening diameter of the first though hole is smaller.

12. A multi-chip module according to claim 2, wherein:

said first substrate includes through holes with a heat expansion coefficient being from 3 ppm/° C. to 5 ppm/° C.;

a third insulation layer is formed to the surface of the second wiring layer on the side opposite to the first substrate; and wherein the third insulation layer relieves the thermal stresses caused between the wiring substrate and a mounting substrate for mounting the wiring substrate.

13. A multi-chip module as defined in claim 12, wherein the first substrate is a glass substrate.

14. A multi-chip module as defined in claim 12, wherein the third insulation layer is formed on a region with no opening of a hole formed in the first substrate.

15. A multi-chip module as defined in claim 12, wherein the heat expansion coefficient of the third insulation layer is from 3 ppm/° C. to 300 ppm/° C.

16. A multi-chip module as defined in claim 12, wherein the thickness of the third insulation layer is from 30 μm to 250 μm.

17. A multi-chip module as defined in claim 12, wherein the third insulation layer is formed by printing using a mask.

18. A multi-chip module as defined in claim 12, wherein the through holes in the first substrate are formed by sand blasting.

19. A multi-chip module as defined in claim 18, wherein the semiconductor device is mounted on the surface where the opening diameter of the first through hole is smaller.

* * * * *